United States Patent
Huang et al.

(10) Patent No.: US 10,097,204 B1
(45) Date of Patent: Oct. 9, 2018

(54) LOW-DENSITY PARITY-CHECK CODES FOR WIFI NETWORKS

(71) Applicant: Marvell International LTD., Hamilton (BM)

(72) Inventors: Jie Huang, San Jose, CA (US); Leilei Song, Sunnyvale, CA (US)

(73) Assignee: MARVELL INTERNATIONAL LTD., Hamilton (BM)

( * ) Notice: Subject to any disclaimer, the term of this patent is extended or adjusted under 35 U.S.C. 154(b) by 436 days.

(21) Appl. No.: 14/681,485

(22) Filed: Apr. 8, 2015

Related U.S. Application Data

(60) Provisional application No. 61/982,129, filed on Apr. 21, 2014, provisional application No. 61/990,209, filed on May 8, 2014, provisional application No. 62/030,900, filed on Jul. 30, 2014.

(51) Int. Cl.
  H03M 13/00 (2006.01)
  H03M 13/11 (2006.01)
  H04L 1/00 (2006.01)

(52) U.S. Cl.
  CPC ....... H03M 13/1102 (2013.01); H04L 1/0057 (2013.01)

(58) Field of Classification Search
  CPC .................. H03M 13/1102; H04L 1/0057
  See application file for complete search history.

(56) References Cited

U.S. PATENT DOCUMENTS

| | | |
|---|---|---|
| 6,795,894 B1 | 9/2004 | Neufeld et al. |
| 6,978,355 B2 | 12/2005 | Mowery et al. |
| 7,263,651 B2 * | 8/2007 | Xia ................. H03M 13/1114 714/774 |
| 7,428,617 B2 | 9/2008 | Okawa et al. |
| 7,800,856 B1 | 9/2010 | Bennett et al. |
| 8,599,510 B1 | 12/2013 | Fallone |
| 8,688,900 B2 | 4/2014 | Eleftheriou et al. |
| 9,129,628 B1 | 9/2015 | Fallone et al. |
| 9,182,915 B2 | 11/2015 | Sutardja |
| 9,323,688 B2 | 4/2016 | Sutardja |
| 9,454,991 B2 | 9/2016 | Sutardja |
| 9,477,611 B2 | 10/2016 | Sutardja |
| 9,559,722 B1 | 1/2017 | Huang et al. |
| 9,594,693 B2 | 3/2017 | Sutardja |

(Continued)

FOREIGN PATENT DOCUMENTS

| | | |
|---|---|---|
| WO | WO-9637844 A1 | 11/1996 |
| WO | WO-2008055272 A2 | 5/2008 |

OTHER PUBLICATIONS

U.S. Appl. No. 61/987,947, Sutardja.

(Continued)

*Primary Examiner* — Sam Rizk

(57) ABSTRACT

A system includes a code rate selecting module and a matrix generating module. The code rate selecting module is configured to select a code rate of k/n to encode k units of data into n units of data using a low-density parity-check (LDPC) code, where k and n are integers greater than 1, and k<n. The matrix generating module is configured to generate a matrix with (R+S) rows and (C+S) columns, where R and C are integers greater than 1, R=C/n, and S is an integer greater than or equal to zero and denotes a number of columns of the matrix deleted after encoding the k units of data using the LDPC code.

23 Claims, 29 Drawing Sheets

(56) References Cited

U.S. PATENT DOCUMENTS

| | | | |
|---|---|---|---|
| 9,733,841 B2 | 8/2017 | Sutardja | |
| 2005/0257119 A1* | 11/2005 | Blankenship | H03M 13/1148 714/759 |
| 2006/0242534 A1 | 10/2006 | Livshitz | |
| 2007/0022362 A1* | 1/2007 | Yue | H03M 13/1185 714/790 |
| 2007/0162815 A1* | 7/2007 | El-Khamy | H03M 13/033 714/752 |
| 2008/0294867 A1 | 11/2008 | Kimura | |
| 2011/0307755 A1 | 12/2011 | Livshitz et al. | |
| 2013/0321948 A1 | 12/2013 | Bandic et al. | |
| 2013/0335856 A1 | 12/2013 | Tanabe et al. | |
| 2015/0113214 A1 | 4/2015 | Sutardja | |
| 2015/0242137 A1 | 8/2015 | Sutardja | |
| 2015/0318022 A1 | 11/2015 | Sutardja | |
| 2017/0177481 A1 | 6/2017 | Sutardja | |

OTHER PUBLICATIONS

U.S. Appl. No. 62/000,657, Huang.
U.S. Appl. No. 62/013,700, Huang.
U.S. Appl. No. 62/013,706, Huang.
Gunnam, Kiran, Choi, Gwan, Wang, Weihuang; Mutli-Rate Layered Decoder Architecture for Blaock LDPC Codes of the IEEE 802.11n WIrless Standard; Department of Electrical and Computer Engineering; 2007; 4 Pages.
IEEE P802.11ac/D2.0 Draft Standard for Information Technology—Telecommunications and information exchange between systems—Local and metropolitan area networks—Specific Requirements; Part 11: Wireless LAN Medium Access Control (MAC) and Physical Layer (PHY) specifications; Amendment 4: Enhancements for Very High Throughput for Operation in Bands below 6 GHz; Jan. 2012; 359 Pages.
IEEE Std 802.11b—1999/ Cor 1-2001; IEEE Standard for Information Technology—Telecommunications and informaiton exchange between systems—Local and metropolitan area networks—Specific requirements; Part 11: Wireless LAN Medium Access Control (MAC) and Physical Layer (PHY) specifiations; Amendment 2: Higher-Speed Phsycial Layer (PHY) extension in the 2.4 GHz Band—Corrigendum 1; 2001; 23 Pages.
International Search Report and Written Opinion for PCT Application No. PCT/US2015/028867 dated Jul. 13, 2015; 10 pages.
U.S. Appl. No. 14/702,078, Sutardja.
U.S. Appl. No. 14/706,335, Huang et al.
U.S. Appl. No. 14/710,988, Sutardja.
International Search Report and Written Opinion for PCT Application No. PCT/US2015/028867 dated Jul. 13, 2015; 9 pages.
Taeho Kgil and Trevor Mudge; "FlashCache: A NAND Flash Memory File Cache for Low Power Web Serviers"; Advanced Computer Architecture Laboratory; The University of Michigan, Ann Arbor, USA; 2006; 13 pages.
Taeho Kgil and Trevor N. Mudge; "FlashCache: A NAND flash memory file cache for low power web servers"; ResearchGate; Jan. 2006; 11 pages.
IEEE P802.11ac™/D5.0; Draft Standard for Information Technology—Telecommunications and information exchange between systems—Local and metropolitan area networks—Specific requirements: Part 11: Wirless LAN Medium Access Control (MAC) and Physical Layer (PHY) specifications: Amendment 4: Enhancements for Very High Throughput for Operation in Bands below 6 GHz; Jan. 2013; 440 Pages.
U.S. Appl. No. 14/681,485, filed Apr. 8, 2015, Huang et al.
U.S. Appl. No. 15/676,395, filed Aug. 14, 2017, Sutardja et al.
"Specification of the Bluetooth System" Master Table of Contents & Compliance Requirements—Covered Core Package version: 4.0; Jun. 30, 2010; 2302 pages.
802.16-2009 IEEE Standard for Local and Metropolitan area networks; Part 16: Air Interface for Broadband Wireless Access Systems; IEEE Computer Society and the IEEE Microwave Theory and Techniques Society; Sponsored by the LAN/MAN Standard Committee; May 29, 2009; 2082 pages.
IEEE P802.11 Wireless LANs; Proposed Specification Framework for TGah; Mar. 2012; 13 Pages.
IEEE P802.11ad / D5.0 (Draft Amendment based on IEEE P802. 11REVmb D10.0) (Amendment to IEEE 802.11 REVmb D10.0 as amended by IEEE 802.11ae D5.0 and IEEE 802.11aa D6.0); Draft Standard for Information Technology—Telecommunications and Information Exchange Between Systems—Local and Metropolitan Area Networks—Specific Requirements; Part 11: Wireless LAN Medium Access Control (MAC) and Physical Layer (PHY) Specifications—Amendment 3: Enhancements for Very High Throughput in the 60 GHz Band; Sponsor IEEE 802.11 Committee of the IEEE Computer Society; Sep. 2011; 601 pages.
IEEE P802.11ah / D1.0 (Amendment to IEEE Std 802.11 REVmc / D1.1, IEEE Std 802.11ac / D5.0 and IEEE Std 802.11af / D3.0) Draft Standard for Information technology—Telecommunications and information exchange between systems Local and metropolitan area networks—Specific requirements; Part 11: Wireless LAN Medium Access Control (MAC) and Physical Layer (PHY) Specifications; Amendment 6: Sub 1 GHz License Exempt Operation; Prepared by the 802.11 Working Group of the LAN/MAN Standards Committee of the IEEE Computer Society; Oct. 2013; 394 pages.
IEEE P802.11g/D8.2 Draft Supplement to Standard [for] Information Technology—Telecommunications and information exchange between systems—Local and metropolitan area networks—Specific requirements—Part 11: Wireless LAN Medium Access Control (MAC) and Physical Layer (PHY) specifications: Further Higher Data Rate Extension in the 2.4 GHz Band; LAN/MAN Standards Committee of the IEEE Computer Society; Apr. 2003; 69 pages.
IEEE P802.20™ V14, Draft 802.20 Permanent Document; <System Requirements for IEEE 802.20 Mobile Broadband Wireless Access Systems—Version 14>; Jul. 16, 2004; 24 Pages.
IEEE Std 802.11a-1999 (Supplement to IEEE Std 802.11-1999) Supplement to IEEE Standard for Information technology—Telecommunications and information exchange between systems—Local and metropolitan area networks—Specific requirements—Part11: Wireless LAN Medium Access Control (MAC) and Physical Layer (PHY) specifications: High-Speed Physical Layer in the 5 GHZ Band; LAN/MAN Standards Committee of the IEEE Computer Society; Sep. 16, 1999; 91 pages.
IEEE Std 802.20-2008; IEEE Standard for Local and metropolitan area networks; Part 20: Air Interface for Mobile Broadband Wireless Access Systems Supporting Vehicular Mobility—Physical and Media Access Control Layer Specification; IEEE Computer Society; Sponsored by the LAN/MAN Standards Committee; Aug. 29, 2008; 1053 pages.
IEEE Std. 802.11-2012; IEEE Standard for Information technology—Telecommunications and information exchange between systems Local and metropolitan area networks—Specific requirements; Part 11: Wireless LAN Medium Access Control (MAC) and Physical Layer (PHY) Specifications; IEEE Computer Society; Sponsored by the LAN/MAN Standards Committee; Mar. 29, 2012; 2793 pages.
International Search Report and Written Opinion for PCT Application No. PCT/US2014/061603 dated Jan. 12, 2015; 11 pages.
Rolf de Vegt; IEEE 802.11ax Selection Procedure (Draft); Jul. 2014; 117 pages.

* cited by examiner

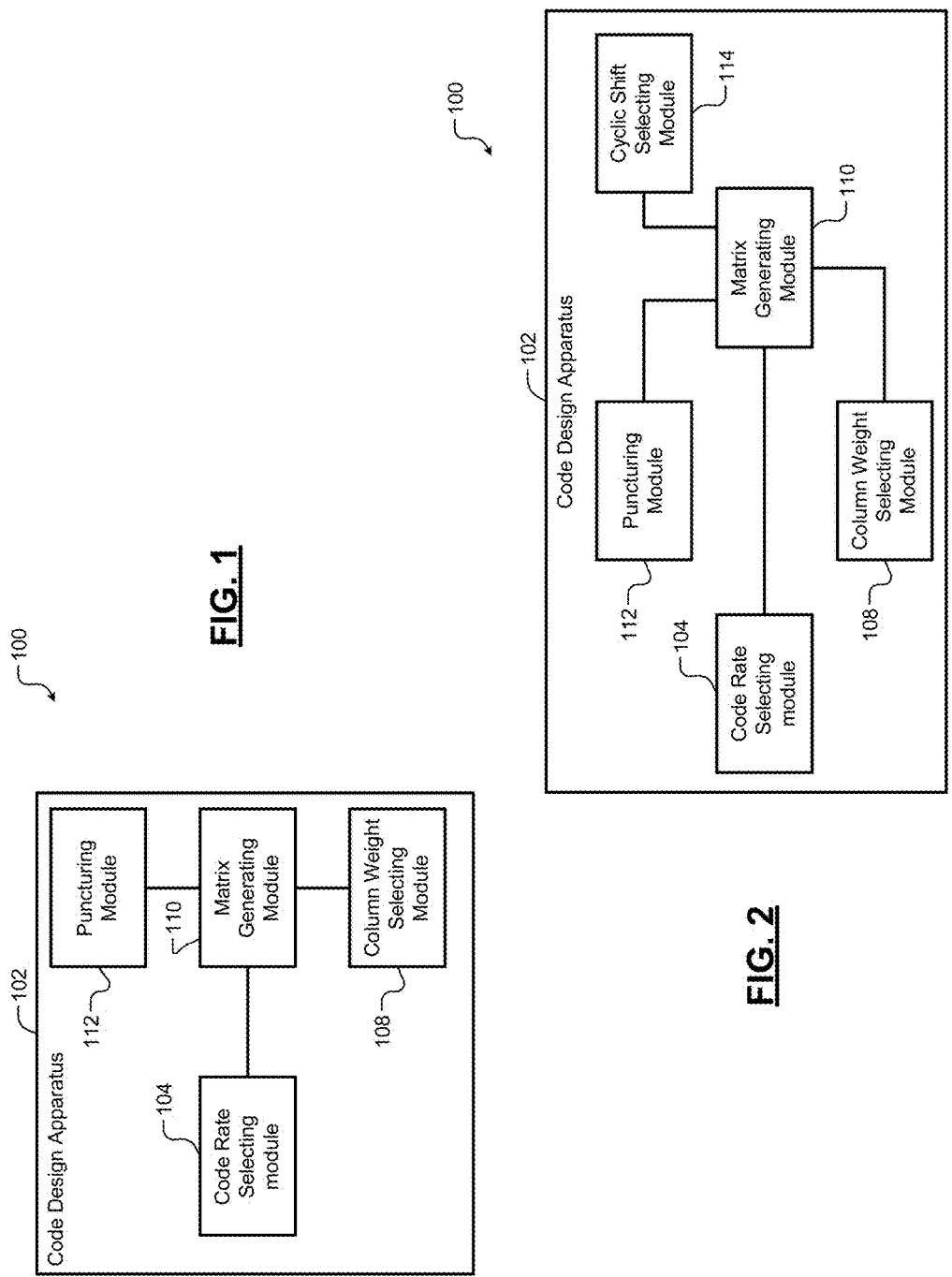

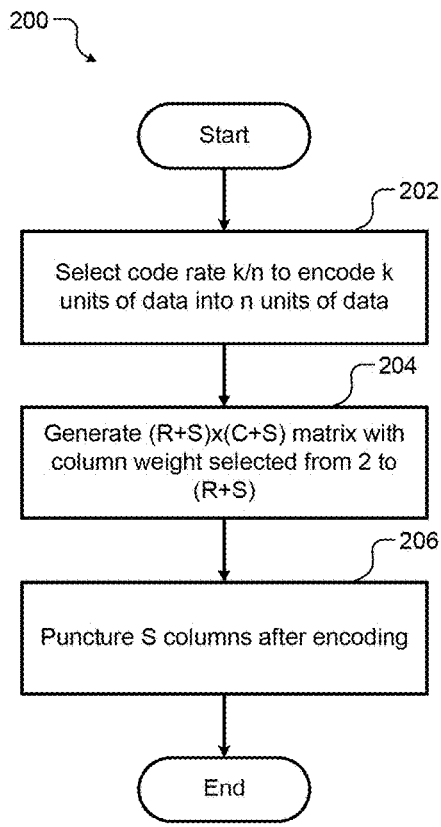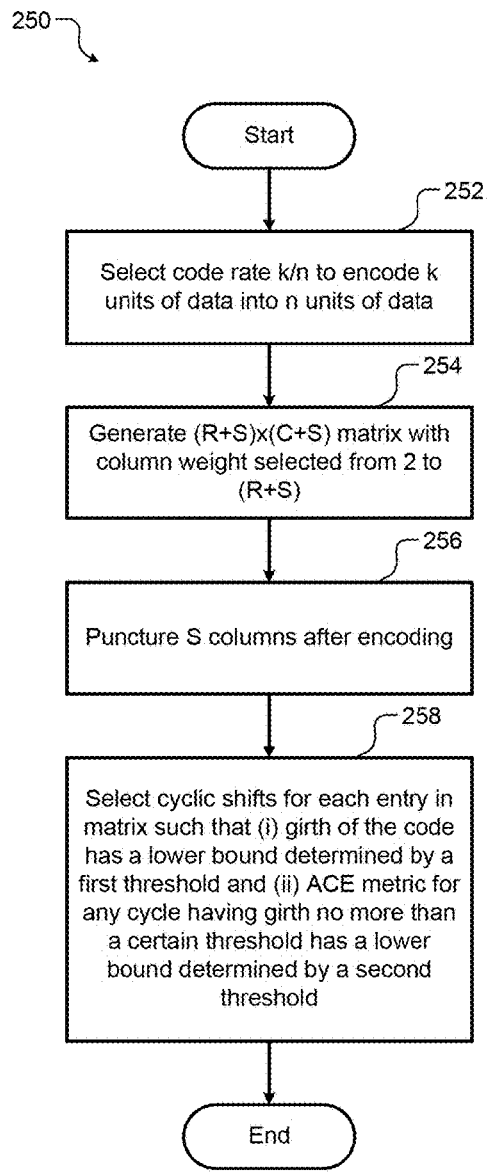
FIG. 4
FIG. 5

| | | |
|---|---|---|
| -1 | 0 | 0 |
| 0 | 0 | -1 |
| 1 | 0 | 1 |
| 41 | 48 | 62 |
| 44 | 2 | 61 |
| 27 | 47 | 6 |
| 49 | 51 | 73 |
| 61 | 36 | 43 |
| 37 | 47 | 49 |
| 32 | 27 | 60 |
| 60 | 28 | 34 |
| 77 | 4 | 71 |
| 52 | 65 | 22 |
| 67 | 16 | 58 |
| 45 | 46 | 49 |
| 57 | 66 | 20 |
| 41 | 37 | 78 |
| 60 | 65 | 29 |
| 54 | 44 | 2 |
| 73 | 57 | 24 |
| 51 | 28 | 4 |
| 55 | 7 | 73 |
| 21 | 27 | 57 |
| 67 | 59 | 5 |

FIG. 14

| | | |
|---|---|---|
| -1 | 0 | 0 |
| 0 | 0 | -1 |
| 1 | 0 | 1 |
| 38 | 25 | 76 |
| 8 | 48 | 23 |
| 73 | 16 | 39 |
| 75 | 24 | 52 |
| 54 | 63 | 66 |
| 3 | 77 | 40 |
| 77 | 9 | 55 |
| 12 | 40 | 61 |
| 69 | 76 | 55 |
| 45 | 6 | 37 |
| 15 | 10 | 40 |
| 11 | 27 | 37 |
| 78 | 11 | 72 |
| 44 | 11 | 66 |
| 4 | 21 | 12 |
| 76 | 13 | 29 |
| 43 | 54 | 41 |
| 63 | 3 | 21 |
| 16 | 45 | 4 |
| 64 | 6 | 33 |
| 47 | -1 | 53 |

FIG. 15

| | | |
|---|---|---|
| -1 | 0 | 0 |
| 0 | 0 | -1 |
| 1 | 0 | 1 |
| 77 | 73 | 14 |
| 46 | 8 | 54 |
| 38 | 52 | 35 |
| 50 | 71 | 41 |
| 75 | 11 | 52 |
| 53 | 8 | 78 |
| 2 | 59 | 41 |
| 58 | 17 | 74 |
| 18 | 51 | 3 |
| 30 | 64 | 59 |
| 34 | 72 | 47 |
| 57 | 20 | 50 |
| 66 | 75 | 47 |
| 32 | 18 | 42 |
| 74 | 68 | 19 |
| 48 | 19 | 38 |
| 28 | 69 | 2 |
| 6 | 54 | 10 |
| 68 | 63 | 55 |
| 39 | -1 | 19 |
| 17 | -1 | 19 |

FIG. 16

| FIG. 17 | | |
|---|---|---|
| -1 | 0 | 0 |
| 0 | 0 | -1 |
| 1 | 0 | 1 |
| 30 | 42 | 39 |
| 55 | 59 | 19 |
| 28 | 35 | 60 |
| 58 | 44 | 32 |
| 20 | 4 | 22 |
| 39 | 56 | 31 |
| 7 | 76 | 43 |
| 15 | 9 | 77 |
| 7 | 56 | 66 |
| 17 | 13 | 43 |
| 68 | 65 | 37 |
| 17 | 68 | 33 |
| 20 | 76 | 39 |
| 26 | 24 | 6 |
| 41 | 63 | 74 |
| 20 | 64 | 48 |
| 37 | 22 | 51 |
| 51 | 33 | 10 |
| 29 | 53 | -1 |
| 56 | -1 | 46 |
| 69 | -1 | 8 |

| FIG. 18 | | |
|---|---|---|
| -1 | 0 | 0 |
| 0 | 0 | -1 |
| 1 | 0 | 1 |
| 41 | 48 | 62 |
| 44 | 2 | 61 |
| 27 | 47 | 6 |
| 49 | 51 | 73 |
| 61 | 36 | 43 |
| 37 | 47 | 49 |
| 32 | 27 | 60 |
| 60 | 28 | 34 |
| 77 | 4 | 71 |
| 52 | 65 | 22 |
| 67 | 16 | 58 |
| 45 | 46 | 49 |
| 57 | 66 | 20 |
| 41 | 37 | 78 |
| 60 | 65 | 29 |
| 54 | 44 | 2 |
| 73 | 57 | 24 |
| 51 | 28 | 4 |
| 55 | 7 | 73 |
| 21 | 27 | 57 |
| 67 | 59 | 5 |

| FIG. 19 | | |
|---|---|---|
| -1 | 0 | 0 |
| 0 | 0 | -1 |
| 1 | 0 | 1 |
| 71 | 41 | 48 |
| 44 | 35 | 19 |
| 60 | 1 | 40 |
| 49 | 55 | 22 |
| 44 | 29 | 0 |
| 19 | 45 | 42 |
| 68 | 80 | 31 |
| 54 | 41 | 75 |
| 21 | 34 | 64 |
| 72 | 30 | 70 |
| 54 | 51 | 46 |
| 31 | 35 | 34 |
| 47 | 28 | 4 |
| 2 | 38 | 52 |
| 66 | 30 | 76 |
| 52 | 1 | 46 |
| 57 | 35 | 66 |
| 37 | 25 | -1 |
| 21 | -1 | 76 |
| -1 | 48 | 75 |
| 76 | -1 | 36 |

FIG. 20

| | | | |
|---|---|---|---|
| -1 | 0 | 0 | -1 |
| 0 | 0 | -1 | -1 |
| 1 | 0 | 1 | -1 |
| 40 | 75 | 72 | 32 |
| 64 | 74 | 42 | 73 |
| 51 | 65 | 48 | 44 |
| 79 | 15 | 43 | 6 |
| 63 | 76 | 5 | 50 |
| 32 | 52 | 13 | 66 |
| 67 | 50 | 25 | 31 |
| 45 | 52 | 43 | -1 |
| 12 | 59 | 75 | 26 |
| 77 | 18 | 29 | 13 |
| 80 | 4 | 42 | 31 |
| 57 | 59 | -1 | 7 |
| -1 | 71 | 44 | -1 |
| -1 | -1 | 43 | 78 |
| 28 | 79 | -1 | -1 |
| -1 | -1 | 18 | 34 |
| 6 | -1 | -1 | 17 |
| -1 | 7 | -1 | 27 |
| 63 | 16 | -1 | -1 |
| -1 | -1 | 74 | 18 |
| 19 | -1 | -1 | 75 |
| -1 | -1 | 9 | 51 |

FIG. 21

| | | | |
|---|---|---|---|
| -1 | 0 | 0 | -1 |
| 0 | 0 | -1 | -1 |
| 1 | 0 | 1 | -1 |
| 78 | 11 | 20 | 17 |
| 28 | 38 | 19 | 17 |
| 8 | 58 | 75 | 18 |
| 1 | 58 | 25 | 34 |
| 12 | 41 | 76 | 76 |
| 21 | 55 | 23 | 65 |
| 76 | 74 | 34 | 18 |
| 49 | 72 | 38 | 44 |
| 73 | 41 | 65 | 70 |
| 18 | 10 | 53 | 43 |
| 34 | 16 | 75 | -1 |
| -1 | 28 | 10 | 5 |
| 42 | 70 | -1 | -1 |
| -1 | -1 | 35 | 54 |
| 0 | -1 | 66 | -1 |
| -1 | 72 | 77 | -1 |
| 44 | -1 | -1 | 43 |
| -1 | 10 | -1 | 28 |
| -1 | 17 | 5 | -1 |
| 16 | -1 | -1 | 71 |
| -1 | -1 | 4 | 30 |
| 53 | -1 | -1 | 46 |

FIG. 22

| | | | |
|---|---|---|---|
| -1 | 0 | 0 | -1 |
| 0 | 0 | -1 | -1 |
| 1 | 0 | 1 | -1 |
| 52 | 15 | 11 | 28 |
| 23 | 42 | 75 | 48 |
| 60 | 74 | 15 | 70 |
| 26 | 55 | 16 | 6 |
| 55 | 46 | 78 | 71 |
| 68 | 57 | 3 | 73 |
| 2 | 23 | 28 | 74 |
| 46 | 69 | 26 | 10 |
| -1 | 62 | 65 | 73 |
| 40 | -1 | 49 | 63 |
| 56 | 7 | 62 | -1 |
| 62 | 56 | -1 | 51 |
| 56 | 12 | -1 | 30 |
| 31 | -1 | 13 | -1 |
| -1 | 4 | 61 | -1 |
| 48 | -1 | -1 | 45 |
| -1 | -1 | 57 | -1 |
| -1 | -1 | 43 | 45 |
| 41 | -1 | -1 | 42 |
| -1 | 59 | -1 | 20 |
| -1 | -1 | 78 | 50 |
| 45 | -1 | -1 | 32 |

FIG. 23

| | | | |
|---|---|---|---|
| -1 | 0 | 0 | -1 |
| 0 | 0 | -1 | -1 |
| -1 | 0 | -1 | -1 |
| 21 | 48 | 76 | 36 |
| 74 | 43 | 51 | 41 |
| 60 | 0 | 73 | 11 |
| 4 | 50 | 25 | 34 |
| 45 | 38 | 64 | 52 |
| 63 | 55 | 22 | 19 |
| 26 | 7 | 44 | 45 |
| 54 | 43 | 25 | 47 |
| 7 | 9 | 23 | -1 |
| 77 | 44 | -1 | 77 |
| -1 | 52 | 37 | 26 |
| 3 | -1 | 38 | 66 |
| 22 | 25 | -1 | 51 |
| -1 | -1 | 47 | 22 |
| -1 | 25 | 6 | -1 |
| 38 | -1 | 2 | -1 |
| -1 | 39 | -1 | 2 |
| 29 | -1 | 27 | -1 |
| -1 | 40 | -1 | 61 |
| 48 | -1 | -1 | 79 |
| 36 | -1 | -1 | 5 |
| -1 | -1 | 55 | 9 |

FIG. 24

| | | | |
|---|---|---|---|
| -1 | 0 | 0 | -1 |
| 0 | 0 | -1 | -1 |
| -1 | 0 | -1 | -1 |
| 2 | 63 | 57 | 58 |
| 56 | 60 | 32 | 26 |
| 21 | 61 | 24 | 6 |
| 24 | 73 | 78 | 13 |
| 3 | 25 | 42 | 29 |
| 7 | 60 | 51 | 17 |
| 78 | 54 | 64 | 26 |
| 76 | 59 | 27 | 12 |
| 19 | 36 | 0 | -1 |
| 28 | -1 | 34 | 30 |
| -1 | 77 | 46 | 23 |
| 15 | 5 | -1 | 16 |
| -1 | 76 | 30 | 67 |
| 56 | -1 | 44 | -1 |
| 38 | 4 | -1 | -1 |
| -1 | 47 | -1 | 16 |
| 54 | -1 | -1 | 14 |
| 34 | -1 | 16 | -1 |
| -1 | -1 | 37 | 17 |
| -1 | 68 | -1 | -1 |
| 28 | -1 | -1 | 34 |
| -1 | -1 | 58 | 31 |

FIG. 25

| | | | |
|---|---|---|---|
| -1 | 0 | 0 | -1 |
| 0 | 0 | -1 | -1 |
| -1 | 0 | -1 | -1 |
| 2 | 40 | 56 | 72 |
| 7 | 75 | 40 | 49 |
| 67 | 17 | 24 | 39 |
| 78 | 44 | 39 | 49 |
| 47 | 35 | 6 | 13 |
| 50 | 14 | 20 | 9 |
| -1 | 41 | 64 | 52 |
| 68 | -1 | 31 | 70 |
| 59 | 54 | 71 | -1 |
| 61 | 69 | -1 | 34 |
| 47 | -1 | 0 | 0 |
| 6 | 56 | -1 | 13 |
| 42 | 32 | 52 | -1 |
| -1 | 25 | 80 | 18 |
| 65 | 4 | -1 | 10 |
| -1 | 27 | 12 | -1 |
| 5 | -1 | -1 | 13 |
| -1 | -1 | 50 | 2 |
| -1 | -1 | 9 | -1 |
| 40 | -1 | -1 | 37 |
| -1 | -1 | 41 | 58 |
| 56 | -1 | -1 | 40 |

FIG. 26

| | | | |
|---|---|---|---|
| -1 | 0 | 0 | -1 |
| 0 | 0 | -1 | -1 |
| -1 | 0 | -1 | -1 |
| 73 | 51 | 41 | 45 |
| 11 | 28 | 30 | 52 |
| 0 | 56 | 3 | -1 |
| 42 | 66 | -1 | 11 |
| 65 | -1 | 36 | 55 |
| -1 | 44 | 68 | 7 |
| 34 | 79 | 38 | -1 |
| 28 | -1 | -1 | 64 |
| 28 | -1 | 35 | 11 |
| -1 | 19 | 8 | 70 |
| 67 | 14 | -1 | 26 |
| 30 | 72 | 39 | -1 |
| -1 | 60 | 22 | 65 |
| 20 | -1 | 33 | 11 |
| 10 | -1 | 30 | 21 |
| -1 | 30 | -1 | 53 |
| 33 | -1 | 15 | -1 |
| 66 | 61 | -1 | -1 |
| -1 | 63 | -1 | 38 |
| -1 | -1 | 49 | 55 |
| 16 | -1 | -1 | 51 |
| -1 | -1 | 21 | 10 |

FIG. 27

| | | | |
|---|---|---|---|
| -1 | 0 | 0 | -1 |
| 0 | 0 | -1 | -1 |
| -1 | 0 | -1 | -1 |
| 71 | 32 | 54 | 25 |
| 18 | 10 | 59 | 75 |
| -1 | 35 | 28 | 5 |
| 24 | -1 | 64 | 12 |
| 60 | 44 | 29 | -1 |
| 23 | 12 | -1 | 48 |
| -1 | -1 | 21 | 8 |
| 32 | 42 | 60 | -1 |
| 55 | -1 | 30 | 67 |
| 22 | 66 | -1 | 19 |
| 69 | 39 | -1 | 40 |
| -1 | 75 | 29 | 11 |
| 42 | 76 | 55 | -1 |
| 53 | -1 | 69 | 28 |
| -1 | 52 | 54 | 48 |
| 67 | 44 | -1 | -1 |
| 11 | -1 | 50 | -1 |
| -1 | -1 | 27 | 48 |
| -1 | 78 | -1 | 21 |
| 27 | -1 | -1 | 75 |
| -1 | -1 | 61 | 41 |
| 79 | -1 | -1 | 65 |

FIG. 28

| | | | |
|---|---|---|---|
| -1 | 0 | 0 | -1 |
| 0 | 0 | -1 | -1 |
| -1 | 0 | -1 | -1 |
| 77 | 10 | 14 | 64 |
| 37 | 52 | 57 | 50 |
| -1 | 67 | 27 | 37 |
| 25 | 11 | -1 | 58 |
| 34 | 25 | 79 | -1 |
| 52 | -1 | 80 | 60 |
| 34 | 37 | 5 | -1 |
| 25 | 18 | -1 | 42 |
| 9 | -1 | 5 | 0 |
| -1 | 62 | 5 | 7 |
| 50 | 61 | 22 | -1 |
| -1 | 60 | 25 | 15 |
| 4 | 6 | -1 | 48 |
| 38 | -1 | 21 | 22 |
| 70 | -1 | 62 | 10 |
| 23 | 60 | -1 | -1 |
| -1 | 17 | -1 | 40 |
| 44 | -1 | 53 | -1 |
| -1 | -1 | 36 | 39 |
| -1 | 5 | -1 | 21 |
| 11 | -1 | -1 | 7 |
| -1 | -1 | 24 | 55 |

| | | |
|---|---|---|
| -1 | 0 | 0 |
| 0 | 0 | -1 |
| 1 | 0 | 1 |
| 74 | 66 | 77 |
| 56 | 72 | 53 |
| 11 | 28 | 18 |
| 61 | 48 | 14 |
| 63 | 19 | 21 |
| 14 | 74 | 77 |
| 8 | 48 | 64 |
| 75 | 60 | 42 |
| 16 | 54 | 69 |
| 71 | 15 | 35 |
| 0 | 57 | 49 |
| 39 | 33 | 59 |
| 39 | 72 | 25 |
| 20 | 55 | 25 |
| 13 | 61 | 55 |
| 25 | 64 | 12 |
| 24 | 44 | 37 |
| 33 | 48 | -1 |
| 80 | -1 | 42 |
| 77 | 79 | -1 |
| -1 | 49 | 80 |
| 48 | -1 | 54 |

FIG. 35

| | | |
|---|---|---|
| -1 | 0 | 0 |
| 0 | 0 | -1 |
| 1 | 0 | 1 |
| 66 | 28 | 7 |
| 34 | 61 | 46 |
| 18 | 28 | 53 |
| 13 | 37 | 61 |
| 68 | 0 | 31 |
| 58 | 75 | 61 |
| 8 | 59 | 19 |
| 5 | 59 | 33 |
| 21 | 9 | 15 |
| 18 | 49 | 76 |
| 74 | 5 | 18 |
| 46 | 22 | 45 |
| 56 | 13 | 49 |
| 21 | 65 | 36 |
| 29 | 49 | 19 |
| 50 | 18 | 79 |
| 40 | 20 | 64 |
| 5 | -1 | 3 |
| 13 | -1 | 60 |
| -1 | 64 | 51 |
| 54 | 12 | -1 |
| 27 | -1 | 64 |

FIG. 36

| | | |
|---|---|---|
| -1 | 0 | 0 |
| 0 | 0 | -1 |
| 1 | 0 | 1 |
| 45 | 11 | 39 |
| 58 | 25 | 63 |
| 21 | 67 | 49 |
| 42 | 53 | 56 |
| 61 | 18 | 1 |
| 63 | 42 | 1 |
| 74 | 60 | 15 |
| 27 | 31 | 61 |
| 0 | 62 | 4 |
| 6 | 70 | 42 |
| 38 | 53 | 68 |
| 62 | 67 | 7 |
| 58 | 14 | 69 |
| 27 | -1 | 11 |
| -1 | 66 | 32 |
| -1 | 76 | 63 |
| 10 | 41 | -1 |
| 7 | -1 | 24 |
| 33 | 42 | -1 |
| -1 | 64 | 42 |
| 55 | -1 | 75 |
| 48 | -1 | 17 |

| | | | |
|---|---|---|---|
| -1 | 0 | 0 | -1 |
| 0 | 0 | -1 | -1 |
| -1 | 0 | -1 | -1 |
| -1 | 70 | 33 | 32 |
| 34 | 53 | 15 | 69 |
| 26 | 32 | 43 | 78 |
| 72 | 3 | 36 | 29 |
| 27 | 56 | 36 | 43 |
| 73 | 23 | 19 | 40 |
| -1 | 51 | 34 | 66 |
| 43 | -1 | 78 | 52 |
| 12 | 17 | -1 | 66 |
| 56 | 0 | 51 | -1 |
| -1 | 57 | 0 | 13 |
| 52 | -1 | -1 | 34 |
| 10 | -1 | -1 | 20 |
| -1 | 36 | 14 | -1 |
| 4 | -1 | 76 | -1 |
| -1 | 56 | -1 | 57 |
| 21 | 18 | -1 | -1 |
| -1 | -1 | 16 | 27 |
| -1 | 38 | 31 | -1 |
| 6 | -1 | -1 | 35 |
| 10 | -1 | -1 | 15 |
| -1 | -1 | 35 | 32 |
| 30 | -1 | -1 | 48 |

FIG. 41

| | | | |
|---|---|---|---|
| -1 | 0 | 0 | -1 |
| 0 | 0 | -1 | -1 |
| -1 | 0 | -1 | -1 |
| -1 | 27 | 37 | 35 |
| 64 | 18 | 6 | 23 |
| 63 | 31 | 36 | 73 |
| 10 | 26 | 28 | 9 |
| 74 | 30 | 56 | 48 |
| 12 | 74 | 50 | 59 |
| -1 | 51 | 16 | 52 |
| 61 | -1 | 30 | 49 |
| 53 | 42 | -1 | 48 |
| -1 | 12 | 76 | 50 |
| 30 | 72 | -1 | 76 |
| 34 | -1 | 40 | -1 |
| 60 | -1 | -1 | 11 |
| -1 | 7 | 42 | -1 |
| 3 | 10 | -1 | -1 |
| -1 | -1 | 25 | 4 |
| -1 | -1 | 13 | 40 |
| 41 | 16 | -1 | -1 |
| 74 | 13 | -1 | -1 |
| -1 | -1 | 26 | 50 |
| 3 | -1 | -1 | 17 |
| -1 | -1 | 51 | 37 |
| 60 | -1 | -1 | 51 |

FIG. 42

| | | | |
|---|---|---|---|
| -1 | 0 | 0 | -1 |
| 0 | 0 | -1 | -1 |
| -1 | 0 | -1 | -1 |
| -1 | 38 | 28 | 50 |
| 75 | 7 | 79 | 72 |
| 31 | 9 | 15 | 39 |
| 37 | 2 | 24 | 70 |
| 16 | 9 | 62 | 57 |
| 38 | 9 | 78 | 40 |
| 50 | 75 | 77 | 33 |
| 69 | 37 | 72 | -1 |
| -1 | 37 | 45 | 51 |
| 59 | 40 | 68 | -1 |
| 18 | -1 | 16 | 60 |
| -1 | 7 | -1 | 25 |
| -1 | -1 | 27 | 5 |
| 6 | 23 | -1 | -1 |
| 63 | -1 | 55 | -1 |
| -1 | 39 | -1 | 28 |
| -1 | 27 | -1 | 9 |
| 64 | -1 | 76 | -1 |
| -1 | -1 | 51 | 60 |
| 5 | 59 | -1 | -1 |
| 29 | -1 | -1 | 61 |
| -1 | -1 | 73 | 45 |
| 66 | -1 | -1 | 60 |

| 1 | 0 | 0 | 1 |
|---|---|---|---|
| 0 | 0 | 1 | 1 |
| 1 | 0 | 1 | 1 |
| 1 | 79 | 64 | 78 |
| 55 | 21 | 7 | 4 |
| 67 | 74 | 38 | 40 |
| 1 | 78 | 77 | 73 |
| 17 | 27 | 1 | 1 |
| 39 | 66 | 74 | 1 |
| 61 | 1 | 21 | 1 |
| 1 | 32 | 1 | 74 |
| 19 | 1 | 1 | 79 |
| 1 | 14 | 34 | 1 |
| 1 | 1 | 35 | 20 |
| 75 | 22 | 1 | 1 |
| 30 | 1 | 1 | 47 |
| 1 | 40 | 14 | 1 |
| 13 | 1 | 2 | 1 |
| 1 | 80 | 1 | 7 |
| 5 | 1 | 1 | 50 |
| 1 | 14 | 23 | 1 |
| 2 | 1 | 1 | 14 |
| 1 | 4 | 53 | 1 |
| 1 | 1 | 76 | 11 |
| 76 | 1 | 1 | 68 |
| 54 | 1 | 1 | 26 |

FIG. 47

| 1 | 0 | 0 | 1 |
|---|---|---|---|
| 0 | 0 | 1 | 1 |
| 1 | 0 | 1 | 1 |
| 1 | 36 | 1 | 66 |
| 52 | 73 | 61 | 21 |
| 25 | 1 | 6 | 80 |
| 1 | 33 | 1 | 32 |
| 1 | 5 | 35 | 1 |
| 68 | 1 | 1 | 32 |
| 1 | 35 | 1 | 68 |
| 24 | 1 | 43 | 1 |
| 73 | 1 | 1 | 39 |
| 1 | 52 | 46 | 1 |
| 1 | 71 | 66 | 1 |
| 21 | 1 | 4 | 1 |
| 39 | 80 | 1 | 1 |
| 1 | 1 | 40 | 77 |
| 19 | 1 | 1 | 26 |
| 1 | 29 | 28 | 1 |
| 21 | 1 | 12 | 1 |
| 1 | 34 | 1 | 54 |
| 77 | 25 | 1 | 1 |
| 1 | 1 | 44 | 24 |
| 1 | 1 | 51 | 76 |
| 68 | 1 | 1 | 59 |
| 4 | 1 | 1 | 0 |

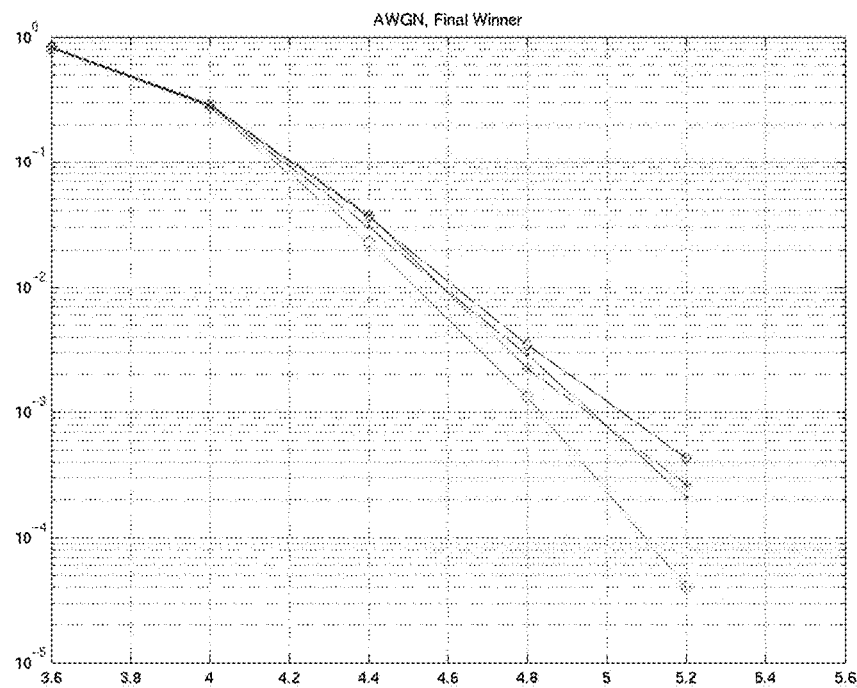
FIG. 48A
FIG. 48B
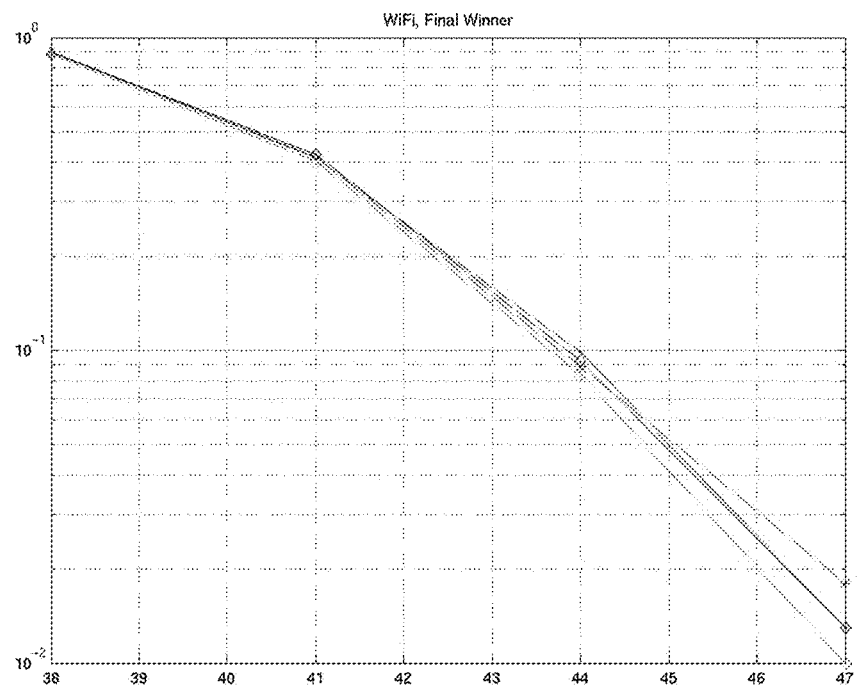

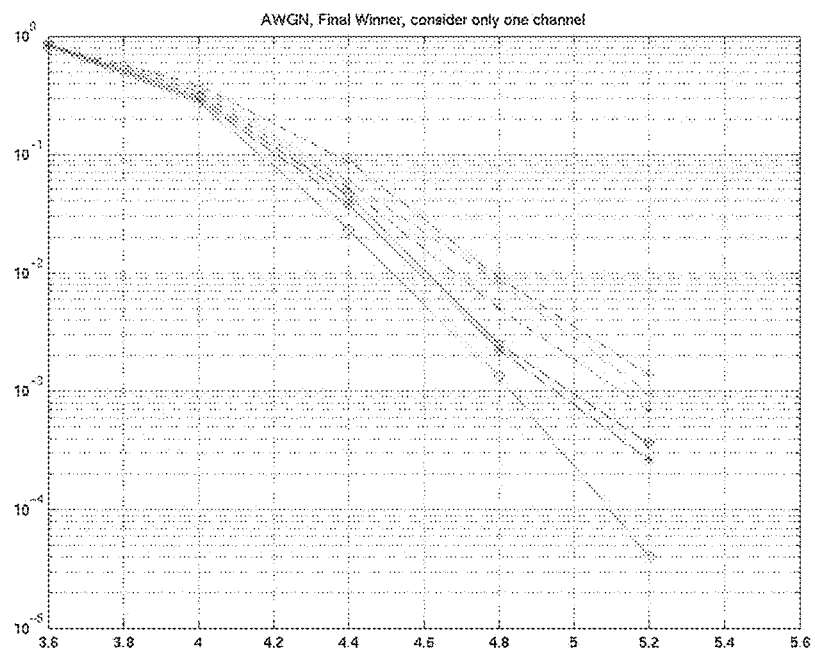
FIG. 49A
FIG. 49B
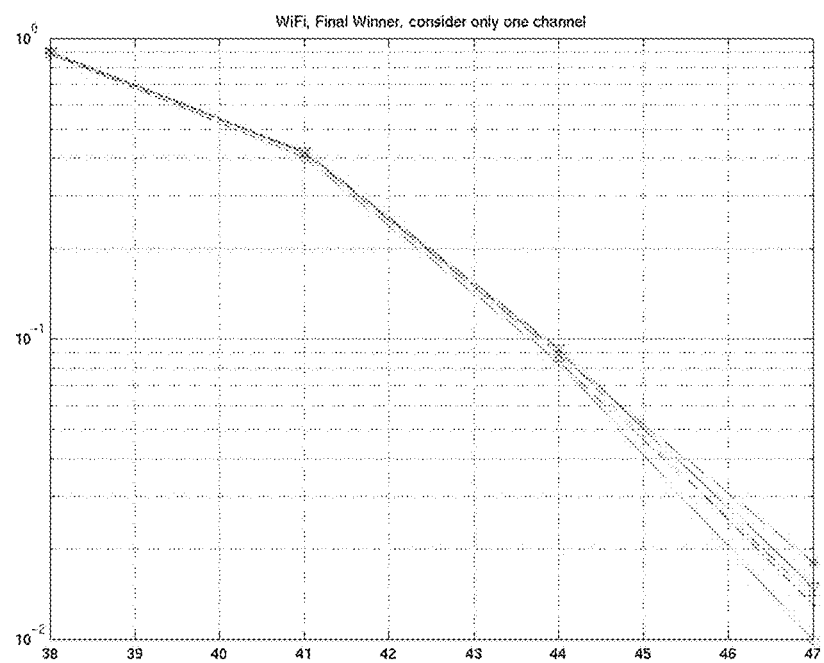

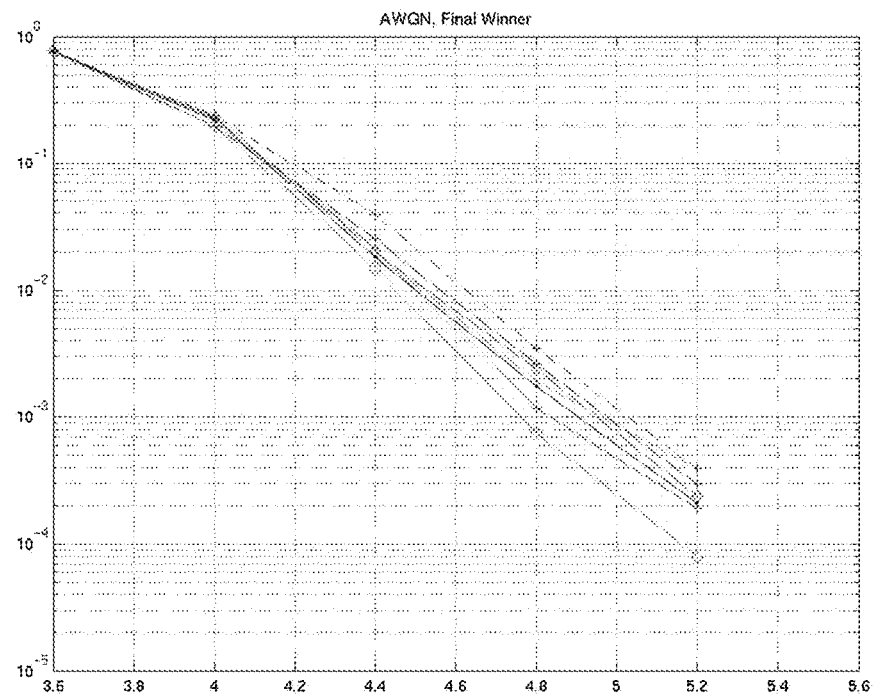
FIG. 50A
FIG. 50B
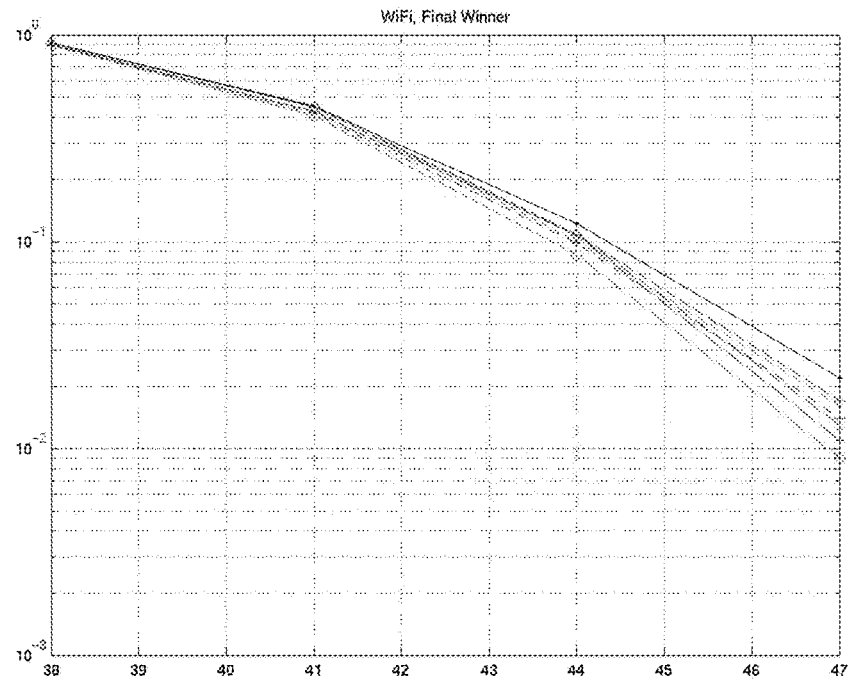

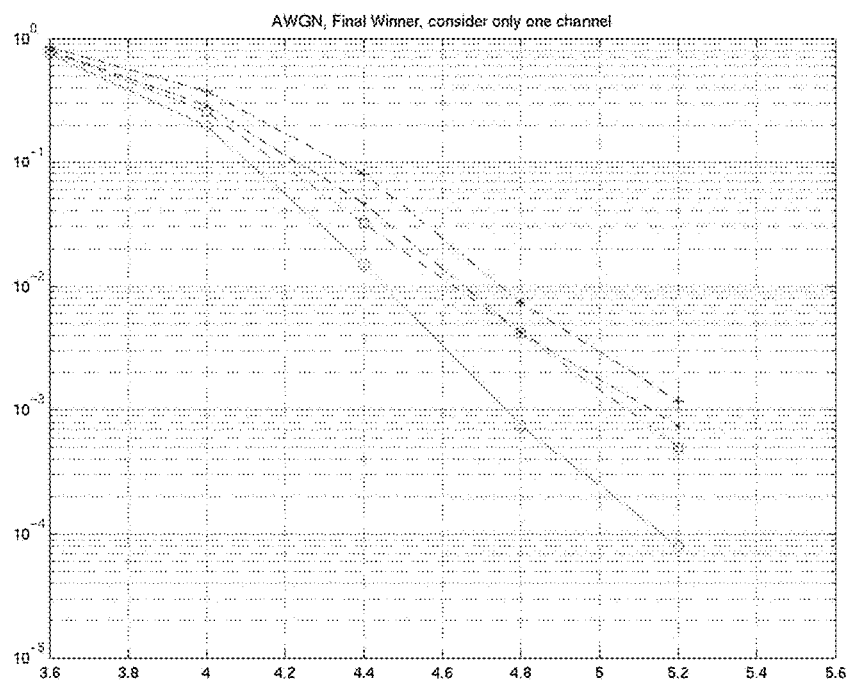
FIG. 51A
FIG. 51B
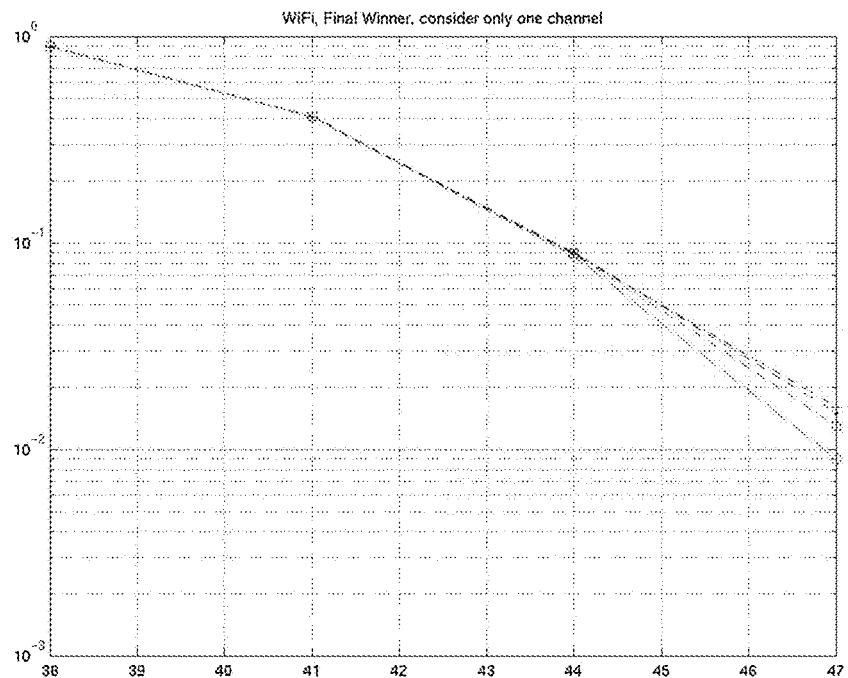

LOW-DENSITY PARITY-CHECK CODES FOR WIFI NETWORKS

CROSS-REFERENCE TO RELATED APPLICATIONS

This application claims the benefit of U.S. Provisional Application No. 61/982,129, filed on Apr. 21, 2014; U.S. Provisional Application No. 61/990,209, filed May 8, 2014; and U.S. Provisional Application No. 62/030,900, filed Jul. 30, 2014. The entire disclosures of the application referenced above are incorporated herein by reference.

This application is related to U.S. Provisional Application No. 62/000,657 filed on May 20, 2014, U.S. Provisional Application No. 62/013,700 filed on Jun. 18, 2014, U.S. Provisional Application No. 62/013,706 filed on Jun. 18, 2014, and U.S. Patent Application No. 61/987,947 filed on May 2, 2014. The disclosures of the above applications are incorporated herein by reference in their entirety.

FIELD

The present disclosure relates generally to wireless communications and more particularly to low-density parity-check (LDPC) codes for WiFi networks.

BACKGROUND

Wireless local area networks (WLANs) have evolved rapidly over the past few years. Progressive WLAN standards have focused primarily on improving data throughputs. For example, the peak data throughputs of IEEE standards 802.11b, 802.11a/g, 802.11n, and 802.11ac are respectively 11 Mbps, 54 Mbps, 600 Mbps, and 7 Gbps. IEEE 802.11ax targets a five to ten times average spectral efficiency gain at least in one dense deployment. It is desirable to increase the per-link data throughput by all means.

To increase data throughput, low-density parity-check (LDPC) codes are used to encode data in wireless networks. LDPC codes are linear block codes whose parity-check matrix H has a favorable property of being sparse, i.e., it contains only a low number of nonzero elements. Tanner graphs of such codes are bipartite graphs containing two different kinds of nodes: variable nodes and check nodes. An (n, k) LDPC code with a code rate k/n is represented by an m×n parity-check matrix H, where m=n-k denotes the redundancy (i.e., parity bits) of the coding scheme. The LDPC codes can be regular or irregular depending on degree distribution of variable nodes (column weights) and check nodes (row weights).

SUMMARY

A system comprises a code rate selecting module and a matrix generating module. The code rate selecting module is configured to select a code rate of k/n to encode k units of data into n units of data using a low-density parity-check (LDPC) code, where k and n are integers greater than 1, and k<n. The matrix generating module is configured to generate a matrix with (R+S) rows and (C+S) columns, where R and C are integers greater than 1, R=C/n, and S is an integer greater than or equal to zero and denotes a number of columns of the matrix deleted after encoding the k units of data using the LDPC code.

In another feature, the system further comprises a column weight selecting module configured to select a column weight from 2 to (R+S), where the column weight denotes a number of nonzero entries in a column of the matrix.

In another feature, the matrix is a concentrated representation of a parity-check matrix of the LDPC code.

In other features, the system further comprises a column weight selecting module and a cyclic shift module. The column weight selecting module is configured to select a column weight distribution for the matrix, where a column weight denotes a number of nonzero entries in a column of the matrix. The matrix generating module is configured to generate the matrix in accordance with the column weight distribution. The cyclic shift module is configured to select cyclic shifts for each entry in the matrix, where based on the cyclic shifts, a girth of the LDPC code has a lower bound determined by a first threshold, where the girth of the LDPC code is a length of a shortest cycle of the LDPC code; and an Approximate Cycle Extrinsic message degree (ACE) metric for any cycle having girth no more than a predetermined threshold has a lower bound determined by a second threshold, where the ACE metric denotes a total number of edges coming into variable nodes of one cycle of the LDPC code.

In other features, the system further comprises a parameter selecting module and a code generating module. The parameter selecting module is configured to select a plurality of parameters ($girth_i$, $ACE_i$), where $girth_i$ is an integer greater than a predetermined threshold greater than zero, $ACE_1$ is an integer greater than or equal to zero, $1<i<n$, and i and n are integers greater than 1. The column weight selecting module is configured to select a plurality of column weight distributions for the matrix. The code generating module is configured to generate, for each of the column weight distributions, a plurality of LDPC codes with the girth; and the $ACE_i$.

In other features, the matrix generating module is configured to generate a matrix for one of the plurality of LDPC codes in accordance with one of the plurality of column weight distributions. The cyclic shift module is configured to generate cyclic shifts for each entry in the matrix. The code generating module is configured to determine, based on the cyclic shifts, whether the one of the plurality of LDPC codes meets the following predetermined criteria: the girth of the one of the plurality of LDPC codes has the lower bound determined by the predetermined threshold; and the ACE metric for any cycle having girth no more than the first threshold has the lower bound determined by the second threshold, where the first threshold is greater than the predetermined threshold.

In another feature, the code generating module is configured to generate, for each of the column weight distributions, the plurality of LDPC codes, by initially using the parameters ($girth_i$, $ACE_i$) with highest values of $girth_i$ and $ACE_i$, and by subsequently using the parameters ($girth_i$, $ACE_i$) with decreasing values of $girth_i$ and $ACE_i$ until one of the plurality of LDPC codes meets the predetermined criteria.

In another feature, in response to none of the plurality of LDPC codes generated using the parameters ($girth_i$, $ACE_i$) meeting the criteria, the parameter selecting module is configured to select a plurality of parameters ($girth_j$, $ACE_j$), where $girth_j$ is an integer greater than zero and less than the predetermined threshold for $girth_i$, $ACE_j$ is an integer greater than or equal to zero, $1<j<n$, and j and n are integers greater than 1; and the code generating module is configured to generate, for each of the column weight distributions, the plurality of LDPC codes, by initially using the parameters ($girth_j$, $ACE_j$) with highest values of $girth_j$ and $ACE_j$, and by subsequently using the parameters (girth$_j$, ACE$_j$) with decreasing values of girth$_j$ and ACE$_j$ until one of the plurality of LDPC codes meets the criteria.

In other features, the column weight selecting module is configured to determine a mean column weight of the plurality of column weight distributions and to select upper and lower bounds of the plurality of column weight distributions based on the mean column weight. The code generating module is configured to generate the plurality of LDPC codes only for values of the plurality of column weight distributions between the upper and lower bounds.

In another feature, the system further comprises an evaluating module configured to evaluate performance of each of the plurality LDPC codes over one or more of an additive white Gaussian noise (AWGN) channel and a WiFi channel using a plurality of criteria including packet error rate and signal-to-noise ratio, where the plurality LDPC codes have different code rates, block lengths, modulations, number of deleted columns from respective matrices, and number of decoding iterations; and to identify one or more of the plurality of column weight distributions for which one or more of the plurality of LDPC codes have performance greater than or equal to a predetermined level.

In another feature, for each of the column weight distributions, the code generating module is configured to stop generating the plurality of LDPC codes in response to two consecutive ones of the plurality LDPC codes having performance worse than prior ones of the plurality LDPC codes.

In other features, the code generating module is configured to generate, for the one or more of the plurality of column weight distributions for which the one or more of the plurality of LDPC codes have performance greater than or equal to the predetermined level, a plurality of codewords using respective LDPC codes. The evaluating module is configured to evaluate performance of the respective LDPC codes over both AWGN and WiFi channels, and to identify one or more parity-check matrices of the respective LDPC codes that perform best over (i) both AWGN and WiFi channels and (ii) either AWGN or WiFi channel.

In still other features, a system comprises a column weight selecting module, a matrix generating module, and a cyclic shift selecting module. The column weight selecting module is configured to select a column weight distribution for a matrix of a low-density parity-check (LDPC) code, where a column weight denotes a number of nonzero entries in a column of the matrix of the LDPC code. The matrix generating module is configured to generate the matrix for the LDPC code in accordance with the column weight distribution. The cyclic shift selecting module is configured to select cyclic shifts for each entry in the matrix, where based on the cyclic shifts, a girth of the LDPC code has a lower bound determined by a first threshold, where the girth of the LDPC code is a length of a shortest cycle of the LDPC code; and an Approximate Cycle Extrinsic message degree (ACE) metric for any cycle having girth no more than a predetermined threshold has a lower bound determined by a second threshold, where the ACE metric denotes a total number of edges coming into variable nodes of one cycle of the LDPC code.

In another feature, the matrix generating module is configured to generate the matrix for the LDPC code in accordance with the column weight distribution using a progressive-edge-growth (PEG) method.

In another feature, the matrix is a concentrated representation of a parity-check matrix of the LDPC code.

In still other features, a system comprises a parameter selecting module, a column weight selecting module, and a code generating module. The parameter selecting module is configured to select a plurality of parameters (girth$_i$, ACE$_i$), where girth denotes a length of a shortest cycle of a low-density parity-check (LDPC) code, ACE is an Approximate Cycle Extrinsic message degree (ACE) of the LDPC code and denotes a total number of edges coming into variable nodes of one cycle of the LDPC code, girth$_i$ is an integer greater than a predetermined threshold greater than zero, ACE$_i$ is an integer greater than or equal to zero, 1<i<n, and i and n are integers greater than 1. The column weight selecting module is configured to select a plurality of column weight distributions for a matrix of the LDPC code, where a column weight denotes a number of nonzero entries in a column of the matrix of the LDPC code. The code generating module is configured to generate, for each of the column weight distributions, a plurality of LDPC codes with the girth$_i$ and the ACE$_i$.

In another feature, the code generating module comprises a matrix generating module and a cyclic shift generating module. The matrix generating module is configured to generate a matrix for one of the plurality of LDPC codes in accordance with one of the plurality of column weight distributions. The cyclic shift generating module is configured to generate cyclic shifts for each entry in the matrix. The code generating module is configured to determine, based on the cyclic shifts, whether the one of the plurality of LDPC codes meets the following criteria: a girth of the one of the plurality of LDPC codes has a lower bound determined by the predetermined threshold; and an ACE metric for any cycle having girth no more than a first threshold has a lower bound determined by a second threshold, where the first threshold is greater than the predetermined threshold.

In another feature, the code generating module is configured to generate, for each of the column weight distributions, the plurality of LDPC codes, by initially using the parameters (girth$_i$, ACE$_i$) with highest values of girth$_i$ and ACE$_i$, and by subsequently using the parameters (girth$_i$, ACE$_i$) with decreasing values of girth$_i$ and ACE$_i$ until one of the plurality of LDPC codes meets the following criteria: a girth of the one of the plurality of LDPC codes has a lower bound determined by the predetermined threshold; and an ACE metric for any cycle having girth no more than a first threshold has a lower bound determined by a second threshold, where the first threshold is greater than the predetermined threshold.

In other features, in response to none of the plurality of LDPC codes generated using the parameters (girth$_i$, ACE$_i$) meeting the criteria, the parameter selecting module is configured to select a plurality of parameters (girth$_j$, ACE$_1$), where girth$_j$ is an integer greater than zero and less than the predetermined threshold for girth$_i$, ACE$_j$ is an integer greater than or equal to zero, 1<j<n, and j and n are integers greater than 1. The code generating module is configured to generate, for each of the column weight distributions, the plurality of LDPC codes, by initially using the parameters (girth$_j$, ACE$_j$) with highest values of girth$_j$ and ACE$_j$, and by subsequently using the parameters (girth$_j$, ACE$_j$) with decreasing values of girth$_j$ and ACE$_j$ until one of the plurality of LDPC codes meets the criteria.

In other features, the column weight selecting module is configured to determine a mean column weight of the plurality of column weight distributions and to select upper and lower bounds of the plurality of column weight distributions based on the mean column weight. The code generating module is configured to generate the plurality of LDPC codes only for values of the plurality of column weight distributions between the upper and lower bounds.

In another feature, the system further comprises an evaluating module configured to evaluate performance of each of the plurality LDPC codes over one or more of an additive white Gaussian noise (AWGN) channel and a WiFi channel using a plurality of criteria including packet error rate and signal-to-noise ratio, where the plurality LDPC codes have different code rates, block lengths, modulations, number of deleted columns from respective matrices, and number of decoding iterations; and to identify one or more of the plurality of column weight distributions for which one or more of the plurality of LDPC codes have performance greater than or equal to a predetermined level.

In another feature, for each of the column weight distributions, the code generating module is configured to stop generating the plurality of LDPC codes in response to two consecutive ones of the plurality LDPC codes having performance worse than prior ones of the plurality LDPC codes.

In other features, the code generating module is configured to generate, for the one or more of the plurality of column weight distributions for which the one or more of the plurality of LDPC codes have performance greater than or equal to the predetermined level, a plurality of codewords using respective LDPC codes. The evaluating module is configured to evaluate performance of the respective LDPC codes over both AWGN and WiFi channels, and to identify one or more parity-check matrices of the respective LDPC codes that perform best over (i) both AWGN and WiFi channels and (ii) either AWGN or WiFi channel.

In still other features, a method comprises selecting a code rate of k/n to encode k units of data into n units of data using a low-density parity-check (LDPC) code, where k and n are integers greater than 1, and k<n. The method further comprises generating a matrix with (R+S) rows and (C+S) columns, where R and C are integers greater than 1, R=C/n, and S is an integer greater than or equal to zero and denotes a number of columns of the matrix deleted after encoding the k units of data using the LDPC code.

In another feature, the method further comprises selecting a column weight from 2 to (R+S), where the column weight denotes a number of nonzero entries in a column of the matrix.

In another feature, the matrix is a concentrated representation of a parity-check matrix of the LDPC code.

In other features, the method further comprises selecting a column weight distribution for the matrix, where a column weight denotes a number of nonzero entries in a column of the matrix; and generating the matrix in accordance with the column weight distribution. The method further comprises selecting cyclic shifts for each entry in the matrix, where based on the cyclic shifts, a girth of the LDPC code has a lower bound determined by a first threshold, where the girth of the LDPC code is a length of a shortest cycle of the LDPC code; and an Approximate Cycle Extrinsic message degree (ACE) metric for any cycle having girth no more than a predetermined threshold has a lower bound determined by a second threshold, where the ACE metric denotes a total number of edges coming into variable nodes of one cycle of the LDPC code.

In other features, the method further comprises selecting a plurality of parameters (girth$_i$, ACE$_i$), where girth$_i$ is an integer greater than a predetermined threshold greater than zero, ACE$_i$ is an integer greater than or equal to zero, 1<i<n, and i and n are integers greater than 1. The method further comprises selecting a plurality of column weight distributions for the matrix; and generating, for each of the column weight distributions, a plurality of LDPC codes with the girth$_i$ and the ACE$_i$.

In other features, the method further comprises generating a matrix for one of the plurality of LDPC codes in accordance with one of the plurality of column weight distributions and generating cyclic shifts for each entry in the matrix. The method further comprises determining, based on the cyclic shifts, whether the one of the plurality of LDPC codes meets the following predetermined criteria: the girth of the one of the plurality of LDPC codes has the lower bound determined by the predetermined threshold; and the ACE metric for any cycle having girth no more than the first threshold has the lower bound determined by the second threshold, where the first threshold is greater than the predetermined threshold.

In other features, the method further comprises generating, for each of the column weight distributions, the plurality of LDPC codes, by initially using the parameters (girth$_i$, ACE$_i$) with highest values of girth$_i$ and ACE$_i$, and by subsequently using the parameters (girth$_i$, ACE$_i$) with decreasing values of girth$_i$ and ACE$_i$ until one of the plurality of LDPC codes meets the predetermined criteria.

In other features, the method further comprises, in response to none of the plurality of LDPC codes generated using the parameters (girth$_i$, ACE$_i$) meeting the criteria, selecting a plurality of parameters (girth$_j$, ACE$_j$), where girth$_j$ is an integer greater than zero and less than the predetermined threshold for girths, ACE$_j$ is an integer greater than or equal to zero, 1<j<n, and j and n are integers greater than 1. The method further comprises generating, for each of the column weight distributions, the plurality of LDPC codes, by initially using the parameters (girth$_j$, ACE$_j$) with highest values of girth$_j$ and ACE$_j$, and by subsequently using the parameters (girth$_j$, ACE$_j$) with decreasing values of girth$_j$ and ACE$_j$ until one of the plurality of LDPC codes meets the criteria.

In other features, the method further comprises determining a mean column weight of the plurality of column weight distributions and to select upper and lower bounds of the plurality of column weight distributions based on the mean column weight. The method further comprises generating the plurality of LDPC codes only for values of the plurality of column weight distributions between the upper and lower bounds.

In other features, the method further comprises evaluating performance of each of the plurality LDPC codes over one or more of an additive white Gaussian noise (AWGN) channel and a WiFi channel using a plurality of criteria including packet error rate and signal-to-noise ratio, where the plurality LDPC codes have different code rates, block lengths, modulations, number of deleted columns from respective matrices, and number of decoding iterations. The method further comprises identifying one or more of the plurality of column weight distributions for which one or more of the plurality of LDPC codes have performance greater than or equal to a predetermined level.

In another feature, the method further comprises, for each of the column weight distributions, stopping generation of the plurality of LDPC codes in response to two consecutive ones of the plurality LDPC codes having performance worse than prior ones of the plurality LDPC codes.

In other features, the method further comprises generating, for the one or more of the plurality of column weight distributions for which the one or more of the plurality of LDPC codes have performance greater than or equal to the predetermined level, a plurality of codewords using respective LDPC codes. The method further comprises evaluating performance of the respective LDPC codes over both AWGN and WiFi channels, and to identify one or more parity-check matrices of the respective LDPC codes that perform best over (i) both AWGN and WiFi channels and (ii) either AWGN or WiFi channel.

In still other features, a method comprises selecting a column weight distribution for a matrix of a low-density parity-check (LDPC) code, where a column weight denotes a number of nonzero entries in a column of the matrix of the LDPC code, and generating the matrix for the LDPC code in accordance with the column weight distribution. The method further comprises selecting cyclic shifts for each entry in the matrix, where based on the cyclic shifts, a girth of the LDPC code has a lower bound determined by a first threshold, where the girth of the LDPC code is a length of a shortest cycle of the LDPC code; and an Approximate Cycle Extrinsic message degree (ACE) metric for any cycle having girth no more than a predetermined threshold has a lower bound determined by a second threshold, where the ACE metric denotes a total number of edges coming into variable nodes of one cycle of the LDPC code.

In another feature, the method further comprises generating the matrix for the LDPC code in accordance with the column weight distribution using a progressive-edge-growth (PEG) method.

In another feature, the matrix is a concentrated representation of a parity-check matrix of the LDPC code.

In still other features, a method comprises selecting a plurality of parameters ($girth_i$, $ACE_i$), where girth denotes a length of a shortest cycle of a low-density parity-check (LDPC) code, ACE is an Approximate Cycle Extrinsic message degree (ACE) of the LDPC code and denotes a total number of edges coming into variable nodes of one cycle of the LDPC code, $girth_i$ is an integer greater than a predetermined threshold greater than zero, $ACE_i$ is an integer greater than or equal to zero, $1<i<n$, and i and n are integers greater than 1. The method further comprises selecting a plurality of column weight distributions for a matrix of the LDPC code, where a column weight denotes a number of nonzero entries in a column of the matrix of the LDPC code. The method further comprises generating, for each of the column weight distributions, a plurality of LDPC codes with the girth; and the $ACE_i$.

In other features, the method further comprises generating a matrix for one of the plurality of LDPC codes in accordance with one of the plurality of column weight distributions and generating cyclic shifts for each entry in the matrix. The method further comprises determining, based on the cyclic shifts, whether the one of the plurality of LDPC codes meets the following criteria: a girth of the one of the plurality of LDPC codes has a lower bound determined by the predetermined threshold; and an ACE metric for any cycle having girth no more than a first threshold has a lower bound determined by a second threshold, where the first threshold is greater than the predetermined threshold.

In other features, the method further comprises generating, for each of the column weight distributions, the plurality of LDPC codes, by initially using the parameters ($girth_i$, $ACE_i$) with highest values of $girth_i$ and $ACE_i$, and by subsequently using the parameters ($girth_i$, $ACE_i$) with decreasing values of $girth_i$ and $ACE_i$ until one of the plurality of LDPC codes meets the following criteria: a girth of the one of the plurality of LDPC codes has a lower bound determined by the predetermined threshold; and an ACE metric for any cycle having girth no more than a first threshold has a lower bound determined by a second threshold, where the first threshold is greater than the predetermined threshold.

In other features, the method further comprises, in response to none of the plurality of LDPC codes generated using the parameters ($girth_i$, $ACE_i$) meeting the criteria, selecting a plurality of parameters ($girth_j$, $ACE_j$), where $girth_j$ is an integer greater than zero and less than the predetermined threshold for $girth_i$, $ACE_j$ is an integer greater than or equal to zero, $1<j<n$, and j and n are integers greater than 1. The method further comprises generating, for each of the column weight distributions, the plurality of LDPC codes, by initially using the parameters ($girth_j$, $ACE_j$) with highest values of $girth_j$ and $ACE_j$, and by subsequently using the parameters ($girth_j$, $ACE_1$) with decreasing values of $girth_j$ and $ACE_j$ until one of the plurality of LDPC codes meets the criteria.

In other features, the method further comprises determining a mean column weight of the plurality of column weight distributions and to select upper and lower bounds of the plurality of column weight distributions based on the mean column weight. The method further comprises generating the plurality of LDPC codes only for values of the plurality of column weight distributions between the upper and lower bounds.

In other features, the method further comprises evaluating performance of each of the plurality LDPC codes over one or more of an additive white Gaussian noise (AWGN) channel and a WiFi channel using a plurality of criteria including packet error rate and signal-to-noise ratio, where the plurality LDPC codes have different code rates, block lengths, modulations, number of deleted columns from respective matrices, and number of decoding iterations. The method further comprises identifying one or more of the plurality of column weight distributions for which one or more of the plurality of LDPC codes have performance greater than or equal to a predetermined level.

In another feature, the method further comprises, for each of the column weight distributions, stopping generation of the plurality of LDPC codes in response to two consecutive ones of the plurality LDPC codes having performance worse than prior ones of the plurality LDPC codes.

In other features, the method further comprises generating, for the one or more of the plurality of column weight distributions for which the one or more of the plurality of LDPC codes have performance greater than or equal to the predetermined level, a plurality of codewords using respective LDPC codes. The method further comprises evaluating performance of the respective LDPC codes over both AWGN and WiFi channels, and to identify one or more parity-check matrices of the respective LDPC codes that perform best over (i) both AWGN and WiFi channels and (ii) either AWGN or WiFi channel.

Further areas of applicability of the present disclosure will become apparent from the detailed description, the claims and the drawings. The detailed description and specific examples are intended for purposes of illustration only and are not intended to limit the scope of the disclosure.

BRIEF DESCRIPTION OF DRAWINGS

FIG. 1 is a block diagram of a system including a code design apparatus that selects code rates for low-density parity-check (LDPC) according to the present disclosure.

FIG. 2 is a block diagram of a system including a code design apparatus that generates LDPC codes according to the present disclosure.

FIG. 4 is a flowchart of a method for designing a base structure for generating LDPC codes according to the present disclosure.

FIG. 5 is a flowchart of a method for designing LDPC codes according to the present disclosure.

FIGS. 7A and 7B show examples of base matrices for code rate 7/8 generated using code design methods according to the present disclosure.

FIGS. 13A and 13B show examples of base matrices for code rate 11/12 generated using code design methods according to the present disclosure.

FIGS. 14-19 show various examples of 3×24 base matrices with column weights of 2 or 3 for code rate 7/8 with a block length of 1944 bits for WiFi channel generated without puncturing according to the present disclosure.

FIGS. 20-28 show various examples of 4×25 base matrices with column weights of 2, 3, or 4 for code rate 7/8 with a block length of 1944 bits for WiFi channel generated with puncturing of one column according to the present disclosure.

Figures 31, 32, 33:
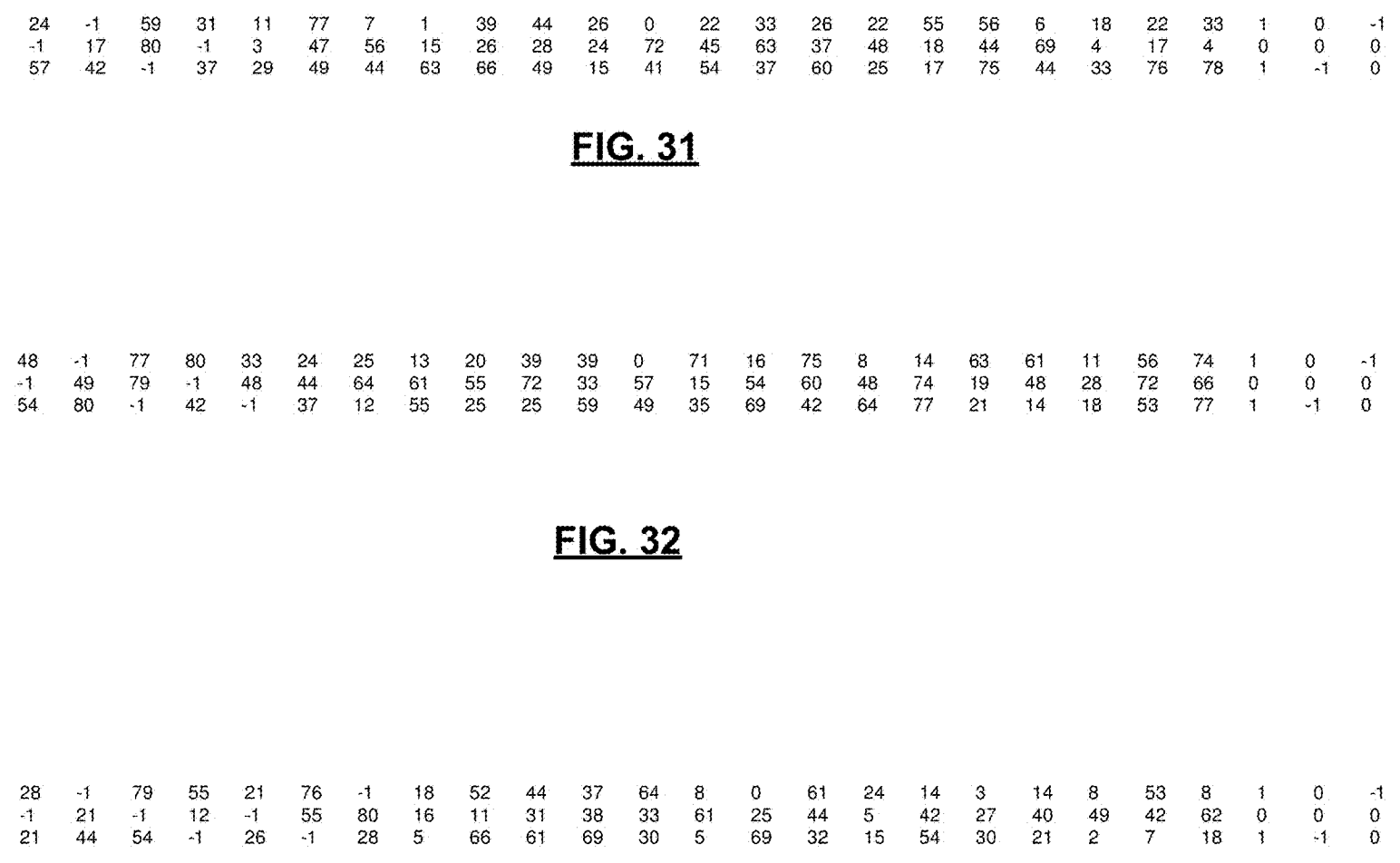
Figures 37, 38, 39:
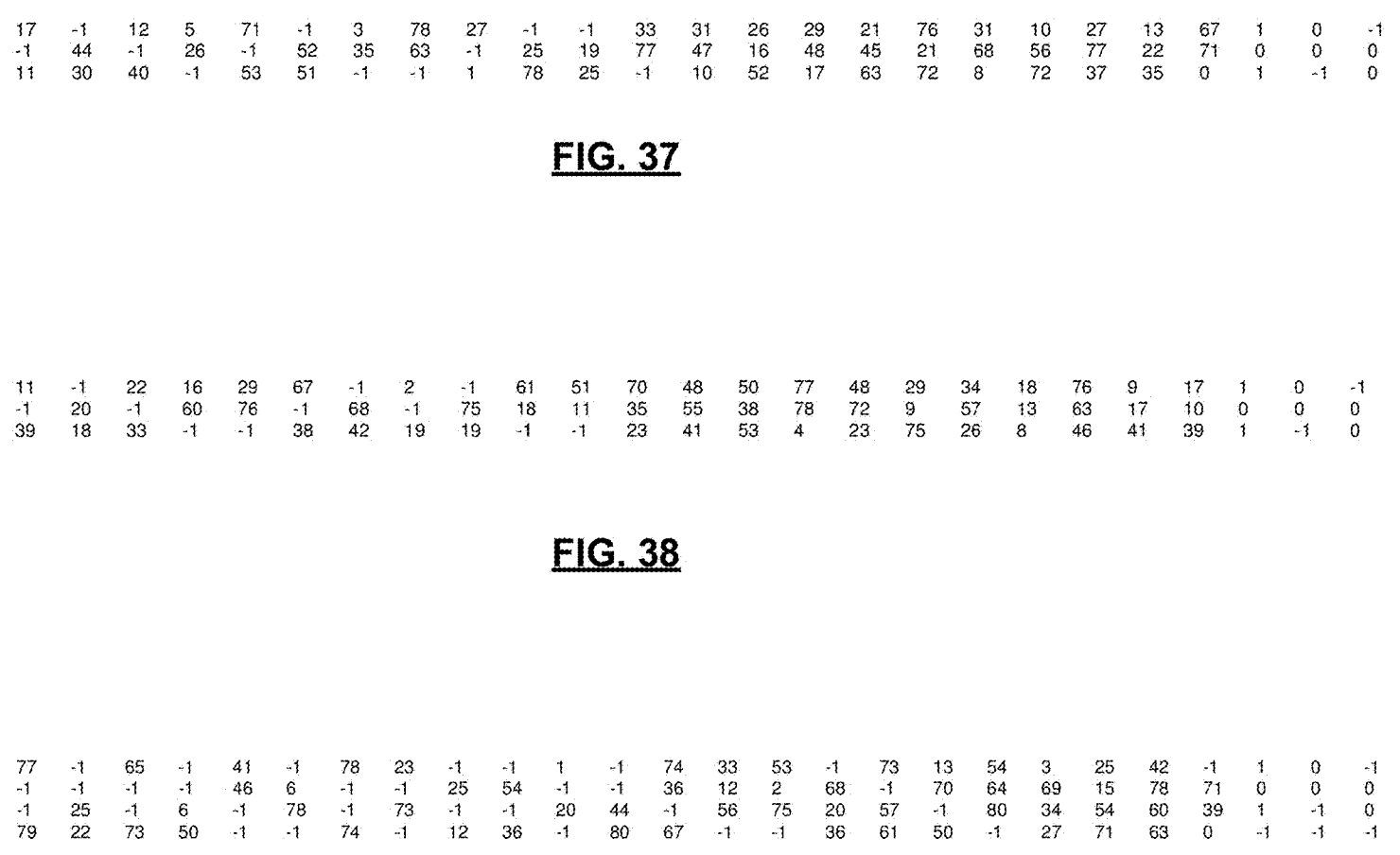

FIGS. 31-38 show various examples of 3×25 base matrices with column weights of 2 or 3 for code rate 11/12 with a block length of 1944 bits for WiFi channel generated with puncturing of one column according to the present disclosure.

Figures 43, 44, 45:
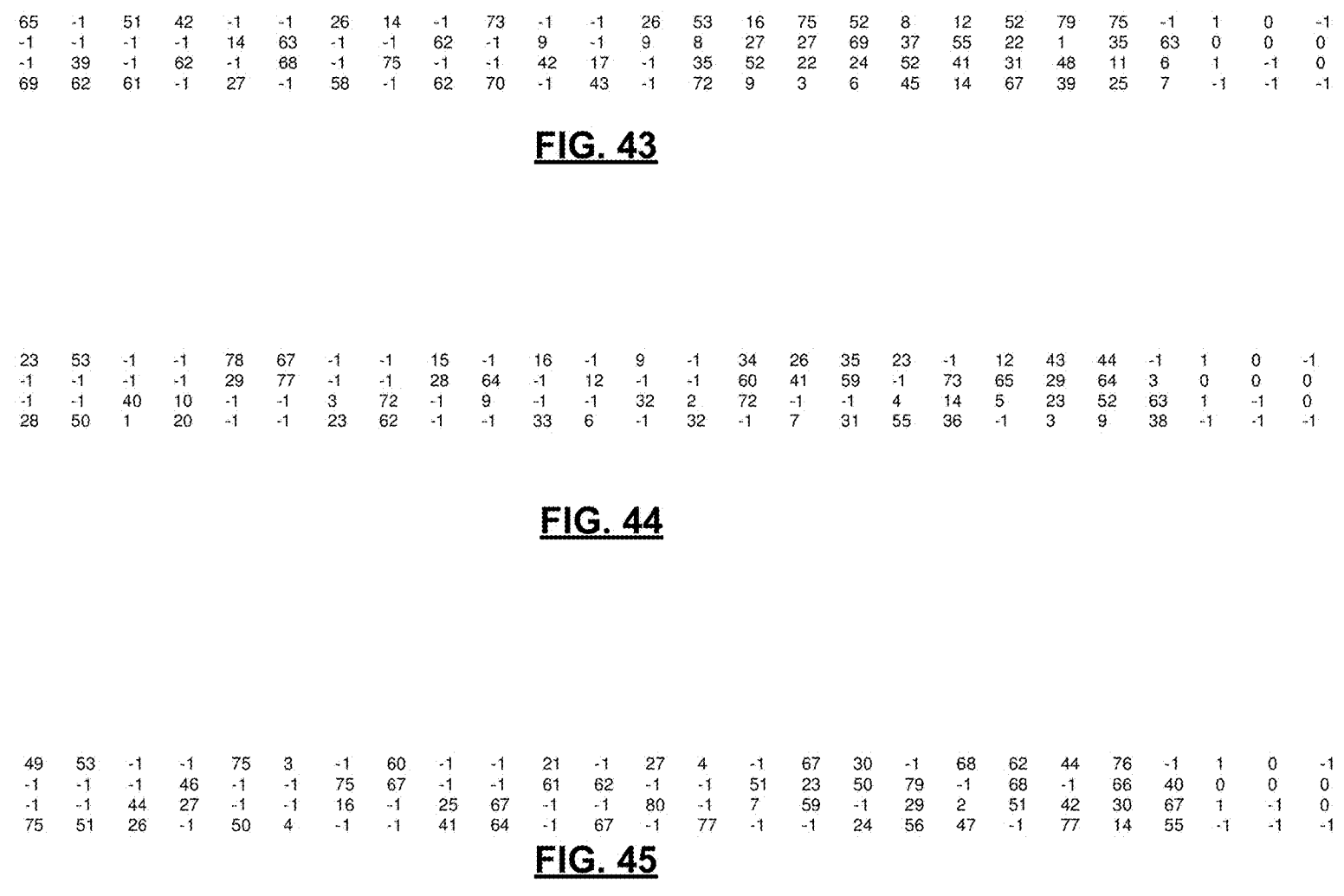

FIGS. 39-47 show various examples of 4×26 base matrices with column weights of 2, 3, or 4 for code rate 11/12 with a block length of 1944 bits for WiFi channel generated with puncturing of two columns according to the present disclosure.

FIGS. 48A-51B show various examples of performance of codes with code rate 11/12 generated using 3×25 and 4×26 base matrices designed according to the present disclosure.

In the drawings, reference numbers may be reused to identify similar and/or identical elements.

DESCRIPTION

Figure 3:
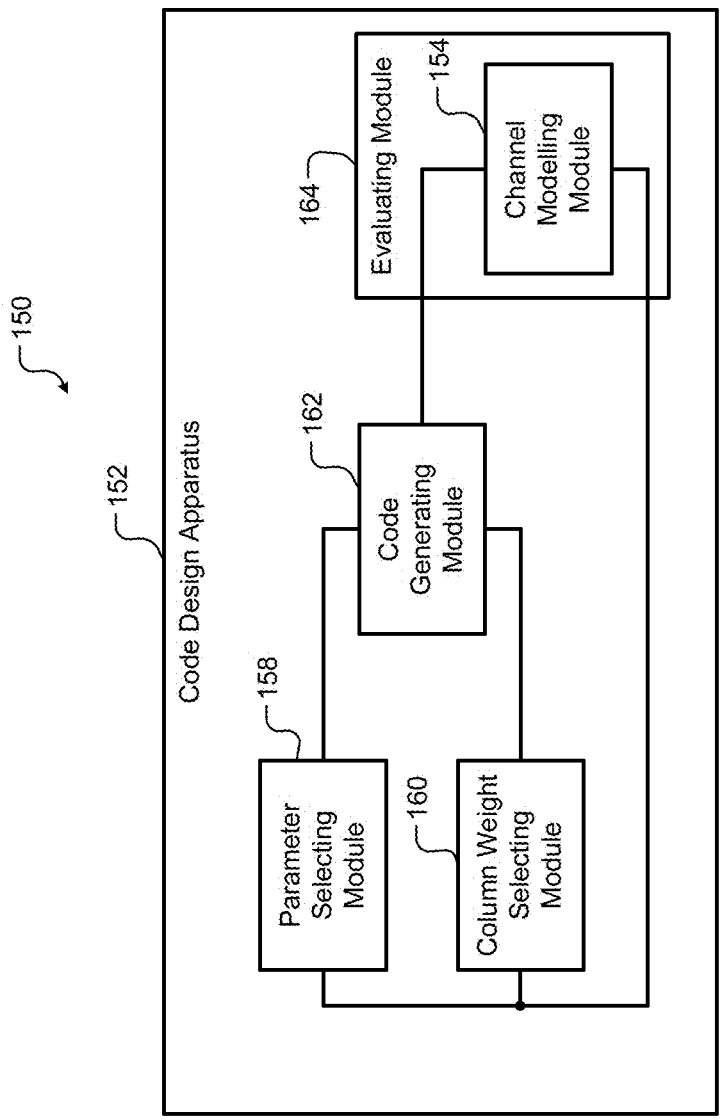
FIG. 3 is a block diagram of a system including a code design apparatus that searches for LDPC codes suitable for Additive White Gaussian Noise (AWGN) and/or WiFi channels according to the present disclosure.

WiFi networks compliant with IEEE802.11n/ac standards use quasi-cyclic (QC) low-density parity-check (LDPC) codes to encode data. A parity-check matrix of a QC-LDPC code includes circulant sub-matrices. These networks typically use block lengths of 648, 1296, 1944. These networks use QC-LDPC codes with code rates of 1/2, 2/3, 3/4, and 5/6, where a code rate of k/n indicates that k units of data (e.g., bits) are encoded into n units of data, where k and n are integers greater than 1, and k<n. The QC-LDPC codes have base matrices with 24 columns. For example, the base matrices for the code rates 1/2, 2/3, 3/4, and 5/6 are 12×24, 8×24, 6×24, and 4×24 matrices, respectively. The expansion factors for the three codeword lengths are respectively 27 (block length 648 divide by 24), 54 (block length 1296 divide by 24), and 81 (block length 1944 divide by 24). WiFi receivers use Layered Belief Propagation decoding to decode the data encoded with these QC-LDPC codes.

The present disclosure relates to novel LDPC code designs with higher code rates. Specifically, the present disclosure proposes novel LDPC code structures, code design criteria, and code search procedures. The proposed base structure is constrained to QC-LDPC codes with base matrices of 24 or so columns and similar codeword lengths as existing 802.11n/ac LDPC code structure so that the existing 802.11n/ac LDPC implementations can support the new codes with minimal changes.

FIG. 1 shows a system 100 including a code design apparatus 102 according to the present disclosure. The code design apparatus 102 designs QC-LDPC codes having the proposed base structure as follows. The code design apparatus 102 includes a code rate selecting module 104, a column weight selecting module 108, a matrix generating module 110, and a puncturing module 112.

The code rate selecting module 104 is configured to select a code rate of k/n to encode k units of data into n units of data using a QC-LDPC code, where k and n are integers greater than 1, and k<n. The code rate k/n is greater than the code rates 1/2, 2/3, 3/4, and 5/6. For example only, the code rate k/n may include 7/8, 11/12, and so on.

The matrix generating module 110 is configured to generate a base matrix of size (R+S)×(C+S) (i.e., with (R+S) rows and (C+S) columns), where the matrix is a concentrated representation of a parity-check matrix of the QC-LDPC code, R+S and C+S respectively denote number of rows and columns of the base matrix and are integers greater than 1, and S is an integer greater than or equal to zero and denotes a number of columns of the base matrix that are punctured (i.e., deleted) by the puncturing module 112 after encoding the data using the QC-LDPC code with code rate k/n=1−R/C. In this disclosure, k=n−1 with n=2, 3, 4, . . . , etc.; and C=24, R/C=1-k/n=1/n.

For example, for a code rate of 7/8, the size of the base matrix is (3+S)×(24+S) with S parity-check columns punctured after encoding the data, where C=24, and the number R=3 is derived by dividing 24 by 8, and where S={0, 1, 2, . . . }. As another example, for a code rate of 11/12, the size of the base matrix is (2+S)×(24+S) with S parity-check columns punctured after encoding the data, where C=24 and the number R=2 is derived by dividing 24 by 12, and where S={0, 1, 2, . . . }.

The column weight selecting module 108 is configured to select a column weight for each column of the base matrix from 2 to (R+S), where the column weight denotes a number of nonzero entries in a column of the base matrix. For example, for code rates 7/8 and 11/12, the column weights are selected from {2, 3, . . . , 3+S} and {2, 3, . . . , 2+S}, respectively.

Puncturing columns allows flexibility in selecting different column weights. If S=0, the size of the base matrix for the code rates 7/8 and 11/12 is 3×24 and 2×24, respectively; and the column weight can be either 2 or 3 for the code rate 7/8, and the column weight for the code rate 11/2 can be 2. The code rates 7/8 and 11/12 are used throughout the present disclosure for example only. The proposed base structure of the QC-LDPC codes can be generalized to other code rates.

FIG. 2 shows the system 100 including the code design apparatus 102 in further detail. The code design apparatus 102 designs a QC-LDPC code that has the proposed base structure and that meets the proposed code design criteria described below. The code design apparatus 102 includes the code rate selecting module 104, the column weight selecting module 108, the matrix generating module 110, the puncturing module 112, which are described with reference to FIG. 1, and a cyclic shift selecting module 114. The proposed code design involves the following two steps and two criteria.

The column weight selecting module 108 is configured to select a column weight distribution for a base matrix of a LDPC code. The column weight denotes a number of nonzero entries in a column of the base matrix of the LDPC code. In a first step, for a selected column weight distribution, the matrix generating module 110 is configured to generate the base matrix for the LDPC code accordance to the selected column weight distribution using a progressive-edge-growth (PEG) method.

In a second step, the cyclic shift selecting module 114 is configured to select cyclic shifts for each entry in the base matrix such that the LDPC code meets two criteria: First, a girth of the LDPC code has a lower bound determined by a first threshold (e.g., 6), where the girth of the LDPC code is a length of a shortest cycle of the LDPC code; and second, an Approximate Cycle Extrinsic message degree (ACE) metric for any cycle having girth no more than a predetermined threshold (e.g., 8) has a lower bound determined by a second threshold (e.g., 2), where the ACE metric denotes a total number of edges coming into variable nodes of one cycle of the LDPC code. This design favors low column weight distribution, which simplifies decoding.

FIG. 3 shows a system 150 including a code design apparatus 152 and a channel evaluating module 164. The channel evaluating module 164 has three components: a transmitting module (not shown), a channel modelling module 154, and a receiving module (also not shown). In some implementations, the channel modelling module 154, whose operation is described below in detail, may simulate the transmit and receive operations of the transmitting and receiving modules, in addition to simulating other aspects of one or more communication channels as described below in detail. The code design apparatus 152 performs a code search procedure according to the present disclosure described below. The code design apparatus 152 identifies one or more codes found in the code search procedure as the code or codes that can be used to encode data.

The code design apparatus 152 includes a parameter selecting module 158, a column weight selecting module 160, a code generating module 162, and an evaluating module 164. The code generating module 162 may include one or more modules of the code design apparatus 102 shown in FIGS. 1 and 2 (e.g., the matrix generating module 110 and the cyclic shift selecting module 114). The evaluating module 164 processes the output of the channel modelling module 154 and evaluates performance of codes generated by the code design apparatus 152 using a plurality criteria including packet error rate (PER) and signal-to-noise ratio (SNR) as explained below in further detail.

The channel modelling module 154 is configured to simulate an AWGN and/or a WiFi channel in which the evaluating module 164 can evaluate performance of the codes generated by the encoder 152. The channel modelling module 154 can simulate transmission and reception of data encoded using the codes generated by the encoder 152 via these channels. The channel modelling module 154 can simulate different channel conditions (e.g., noise, interference, and so on). The channel modelling module 154 is further configured to simulate transmission of encoded data using different modulation schemes, code rates, block lengths, and so on. The channel modelling module 154 is further configured to simulate transmission and reception of encoded data via one or more antennas arranged in different configurations (e.g., a multiple-input multiple-output (MIMO) configuration). Accordingly, the output of the channel modelling module 154 is a simulation of data that is encoded using the code generated by the encoder 152 and that the WiFi device 150 can receive from another WiFi device via the AWGN and/or WiFi channels.

The parameter selecting module 158 is configured to select a predetermined girth threshold greater than zero (e.g., 6), where girth denotes a length of a shortest cycle of a LDPC code. The parameter selecting module 158 is further configured to select a plurality of design parameters (girth$_i$, ACE$_i$) according to a design goal, where ACE is an Approximate Cycle Extrinsic message degree (ACE) of the LDPC code and denotes a total number of edges coming into variable nodes of one cycle of the LDPC code, girth$_i$ is an integer greater than the predetermined girth threshold, ACE$_i$ is an integer greater than or equal to zero, $1<i<n$, and i and n are integers greater than 1. For example, the design parameters (girth$_i$, ACE$_i$) can include (8, 4), (8, 3), (6, 4), (6, 3), (8, 2), (6, 2), (6, 1), and (6, 0).

The column weight selecting module 160 is configured to select a plurality of column weight distributions for a base matrix, where a column weight denotes a number of nonzero entries in a column of the base matrix. For each column weight distribution, the code generating module 162 is configured to generate an LDPC code such that it meets the two criteria mentioned above with reference to FIG. 2.

Specifically, for a first column weight distribution, starting from the hardest design parameter (e.g., (8, 4)), the code generating module 162 is configured to generate a base matrix (e.g., using the matrix generating module 110 shown in FIGS. 1 and 2), and generate cyclic shifts for each entry in the base matrix (e.g., using the cyclic shift selecting module 114 shown in FIG. 2). The code generating module 162 is configured to determine whether the LDPC code meets the following criteria: a girth of the LDPC code has a lower bound determined by the predetermined girth threshold (e.g., 6); and an ACE metric for any cycle having girth no more than a first threshold has a lower bound determined by a second threshold, where the first threshold is greater than the predetermined girth threshold.

If the LDPC code that meets the two criteria is found, the code generating module 162 generates a code using the next column weight distribution. If the LDPC code that meets the two criteria is not found, for the first column weight distribution, the code generating module 162 generates a code using a next design parameter (girth$_i$, ACE$_i$) that is easier (i.e., relaxed) than the previous design parameter (e.g., after using (8, 4), uses (8, 3)).

If an LDPC code that meets the two criteria is not found for the last design parameter (girth$_i$, ACE$_i$) (e.g., (6, 0)), the parameter selecting module 158 translates the girth criterion to an ACE requirement. For example, the parameter selecting module 158 is configured to select a plurality of parameters (girth$_j$, ACE$_j$), where girth$_j$ is an integer greater than zero and is less than the predetermined girth threshold (e.g., $4<6$), ACE is an integer greater than or equal to zero, $1<j<n$, and j and n are integers greater than 1. For example only, the parameters (girth$_j$, ACE$_j$) can include (4, 10), (4, 9), . . . , and (4, 0).

The code generating module 162 is configured to generate, for the first column weight distribution, codes by using the parameters (4, 10), (4, 9), . . . , and (4, 0) until a code that meets the two criteria is found. The code generating module 162 is configured to repeat the above procedure for each column weight distribution. The above iterative code search procedure can be limited or simplified using certain search reduction and search refinement criteria described below.

The evaluating module 164 is configured to evaluate performance of each code generated by the code generating module 162 using the above procedure. The evaluating module 164 is configured to evaluate the performance of the codes over one or more of an AWGN channel and a WiFi channel based on the output of the channel modelling module 154. As explained above, the channel modelling module 154 models these channels and simulates transmission and reception of encoded using the codes under different channel conditions and using different coding rates, block lengths, and modulations.

The evaluating module 164 is configured to evaluate the performance using a plurality of criteria including packet error rate (PER) and signal-to-noise ratio (SNR). For example, the evaluating module 164 is configured to evaluate the performance of a code by generating a curve PER versus SNR of the code. The evaluating module 164 is configured to evaluate the performance of codes having different code rates, block lengths, modulations, number of deleted columns from respective matrices, and number of decoding iterations. The evaluating module 164 is configured to identify one or more column weight distributions for which one or more codes have performance greater than or equal to the best performance of all found codes within a predetermined relative performance tolerance threshold.

To reduce search space, for each column weight distribution, the code generating module 162 is configured to stop generating codes during the iterative code search procedure when multiple (e.g., 4) consecutive codes are found to have performance worse than the previously generated codes. This stoppage of code search is referred to an early stop in one dimensional search along a column weight distribution search space.

The early stop in one dimensional search along the column weight distribution search space is performed as follows. In some cases, the search space of column weight distribution is of multiple dimensions, e.g., for code rate 7/8 using a base matrix of size 4×25, the column weight for each column can be selected from {2, 3, 4}. Then the search space is of two dimensions. Basically, the search space is determined by three parameters denoted as n2, n3, n4, where n2 denotes the number of columns of weight 2, and so on for n3 and n4. Yet n2, n3, and n4 are not independent since they must satisfy n2+n3+n4=21 for code rate 7/8. So effectively there are two free parameters, say n2 and n3, and n4 is determined given n2 and n3.

When browsing through all possible column weight distribution the code search procedure described above goes through all possible combinations of n2 and n3 (n2 can take values from 0 to 21, n3 can take values from 0 to 21). What is meant by one dimensional search is that n3 can be fixed (e.g., n3=0), and n2 can be varied from 0 to (21-n3). As n2 increases, PER versus SNR performance may improve up to some point. Then the performance may get worse and worse compared with the previous value of n2. In that case, if n2 is increased and worse performance is observed, then the search process can be terminated early. That is, basically, the rest of n2 are discarded.

Further, the column weight selecting module 160 is configured to determine a mean column weight of the plurality of column weight distributions. The column weight selecting module 160 is further configured to select upper and lower bounds for the column weight distributions based on the mean column weight. Specifically, for a given column weight distribution, a mean column weight is calculated. For the example used above, the mean column weight is calculated as (2*n2+3*n3+4*n4)/(n2+n3+n4). An upper bound and a lower bound are set based on the mean column weight. The column weight distributions whose mean column weight distribution is out of range set by the lower bound and upper bound are discarded. The code generating module 162 is configured to generate codes only for those values of the column weight distributions that are between the upper and lower bounds. The evaluating module 164 is configured to evaluate performance of the codes over each channel type (AWGN or WiFi). The evaluating module 164 is configured to identify winning column weight distributions (i.e., column weight distributions for which the codes have performance greater than or equal to a predetermined performance threshold).

To refine the code search, for each winning column weight distribution (i.e., column weight distributions for which the codes have performance greater than or equal to a predetermined relative performance tolerance threshold), the code generating module 162 is further configured to generate a plurality of codewords (e.g., 20) to meet the two criteria. The evaluating module 164 is configured to evaluate performance of the codes over both AWGN and WiFi channels. The evaluating module 164 is configured to identify parity-check matrices of those codes that perform best (i.e., have performance greater than or equal to a predetermined performance threshold) over both AWGN and WiFi channels. The evaluating module 164 is further configured to identify parity-check matrices of those codes that perform best (i.e., have performance greater than or equal to a predetermined relative performance tolerance threshold) over either AWGN or WiFi channel.

FIG. 4 shows a method 200 for designing a base structure for generating LDPC codes according to the present disclosure. At 202, a code rate k/n is selected to encode k units of data into n units of data, where k and n are integers greater than 1, and k=n-1. At 204, a base matrix having (R+S) rows and (C+S) columns and with column weight selected from 2 to (R+S) is generated, where R and C are integers greater than 1, R=C/n, and S is an integer greater than or equal to zero and denotes a number of columns punctured after encoding the data. At 206, S columns of the base matrix are punctured after encoding the data.

FIG. 5 shows a method 250 for designing LDPC codes according to the present disclosure. At 252, a code rate k/n is selected to encode k units of data into n units of data, where k and n are integers greater than 1, and k=n-1. At 254, a base matrix having (R+S) rows and (C+S) columns and with column weight selected from 2 to (R+S) is generated, where R and C are integers greater than 1, R=C/n, and S is an integer greater than or equal to zero and denotes a number of columns punctured after encoding the data. At 256, S columns of the base matrix are punctured after encoding the data. At 258, cyclic shifts for each entry in the base matrix are selected such that the LDPC code meets two criteria: First, a girth of the LDPC code has a lower bound determined by a first threshold, where the girth of the LDPC code is a length of a shortest cycle of the LDPC code; and second, an Approximate Cycle Extrinsic message degree (ACE) metric for any cycle having girth no more than a predetermined threshold has a lower bound determined by a second threshold, where the ACE metric denotes a total number of edges coming into variable nodes of one cycle of the LDPC code.

Figure 6A:
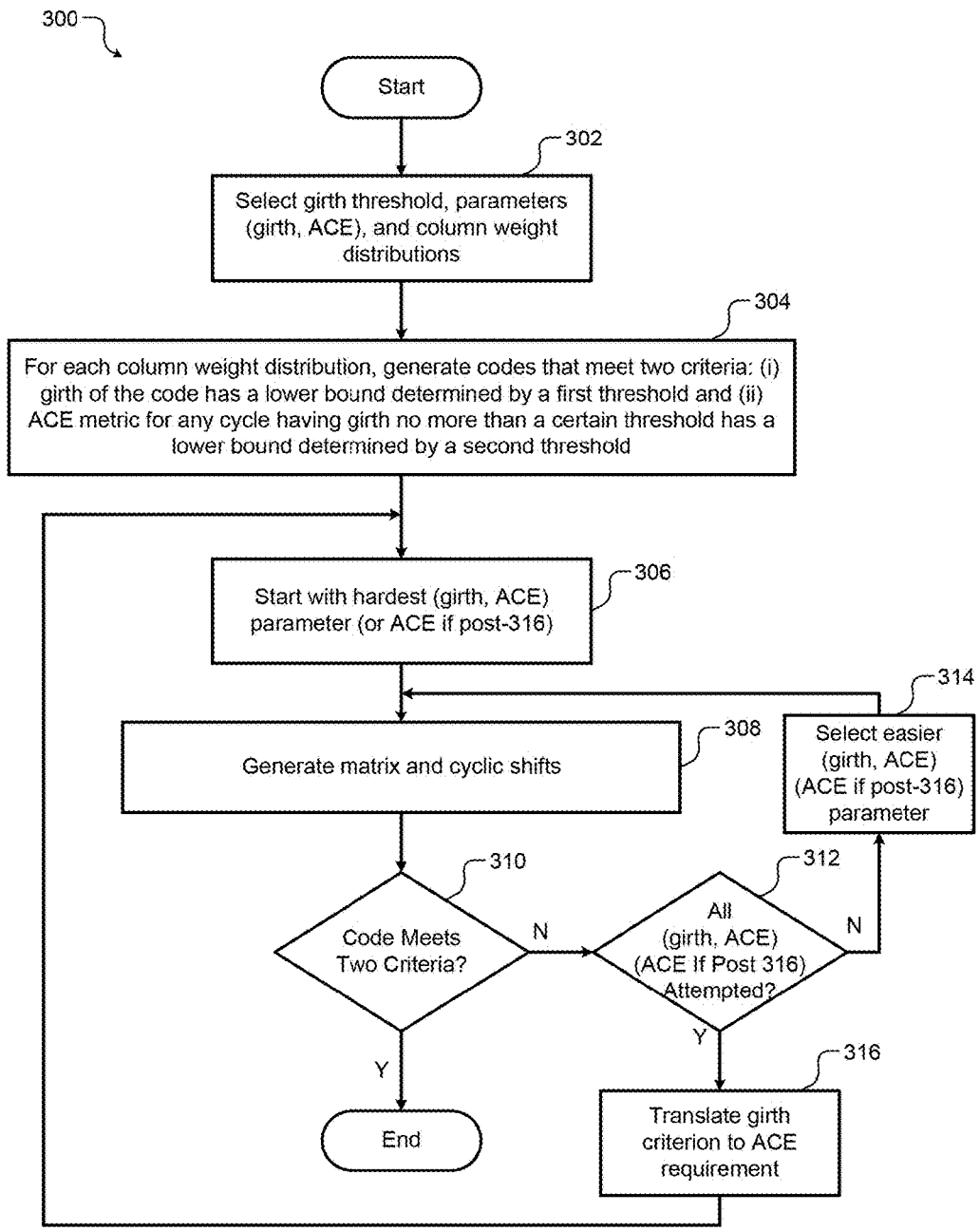
FIG. 6A is a flowchart of a method for generating a code according to the present disclosure.

FIG. 6A shows a method 300 for generating a code that meets the two design criteria according to the present disclosure. At 302, a predetermined girth threshold, design parameters (girth, ACE), and column weight distributions are selected. At 304, for each column weight distribution, codes are generated that meet two criteria: First, a girth of the LDPC code has a lower bound determined by a first threshold, where the girth of the LDPC code is a length of a shortest cycle of the LDPC code; and second, an Approximate Cycle Extrinsic message degree (ACE) metric for any cycle having girth no more than a predetermined threshold has a lower bound determined by a second threshold, where the ACE metric denotes a total number of edges coming into variable nodes of one cycle of the LDPC code.

At 306, for a given column weight distribution, codes are generated starting with the hardest (girth, ACE) parameter (i.e., (girth, ACE) parameter with highest values of girth and ACE). At 308, a base matrix is generated, and cyclic shifts are generated. At 310, whether the code meets the two criteria is determined. Control ends if the code meets the two criteria. At 312, if the code does not meet the two criteria, whether all (girth, ACE) parameters are attempted is determined. At 314, if all (girth, ACE) parameters are not attempted, an easier (girth, ACE) parameter (i.e., (girth, ACE) parameter with lower values of girth and ACE than a previous (girth, ACE) parameter) is selected; and control is returned to 308.

At 316, if all (girth, ACE) parameters are attempted (i.e., a code that meets the two criteria is not found after using all (girth, ACE) parameters), the girth criterion is translated to an ACE requirement; and control is returned to 308. Control executes 308-314 until a code that meets the two criteria is found. Control ends when a code that meets the two criteria is found.

Figure 6B:
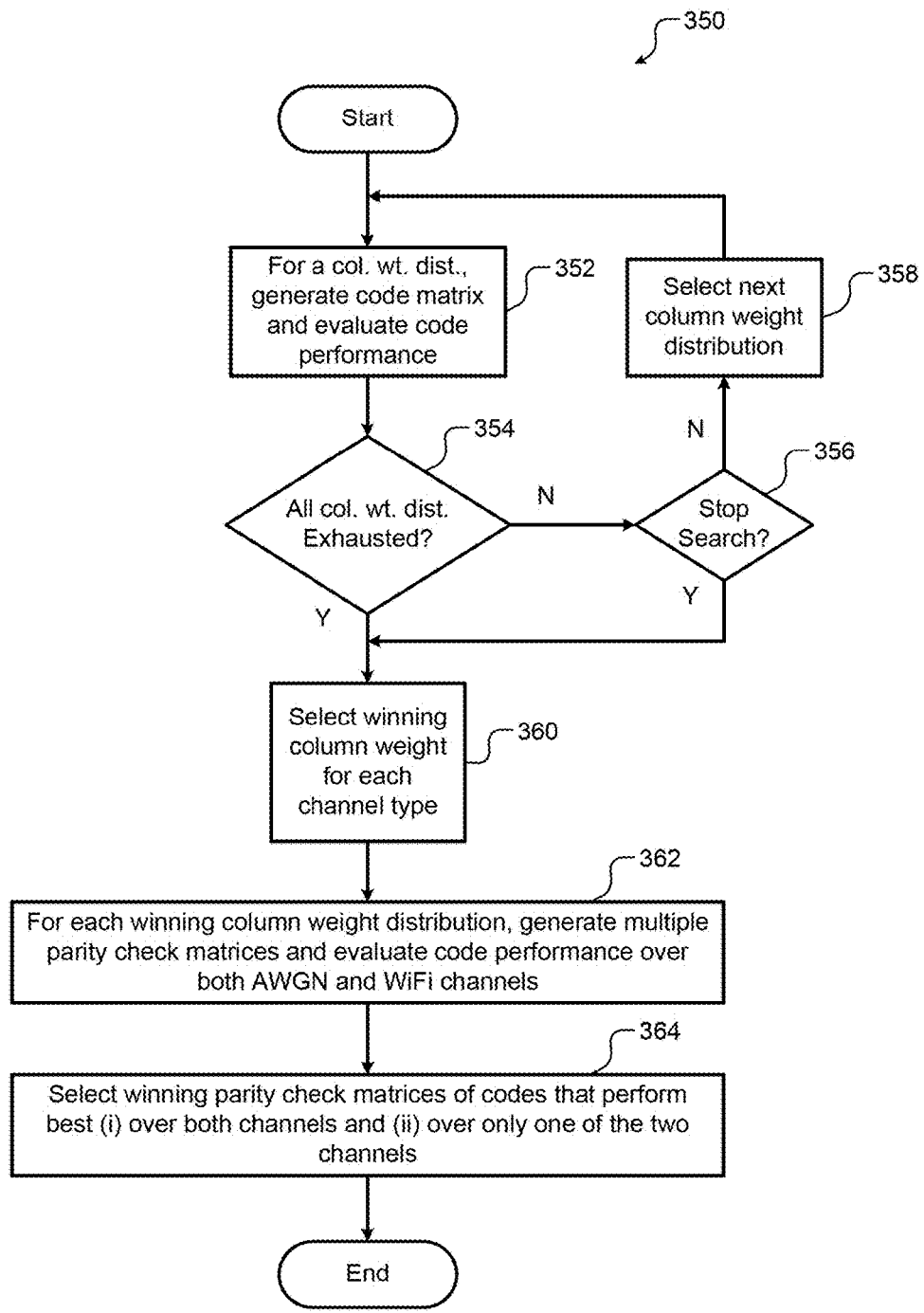
FIG. 6B is a flowchart of a method for reducing search space while performing code search according to the present disclosure.

FIG. 6B shows a method 350 for reducing search space while performing code search according to the present disclosure. The method 350 goes through all possible column weight distributions unless the code search can be terminated early as explained below. At 352, for a given column weight distribution, code matrix is generated and performance of the code that meets the two criteria (see FIG. 6A) is evaluated. A354, whether all possible column weight distributions are exhausted is determined. At 356, if all possible column weight distributions are not yet exhausted, whether to stop the code search early is determined. For example, the code search may be stopped early in one dimensional search along the column weight distribution search space as explained above. At 358, if the search is to be continued, the next column weight distribution is selected, and control is returned to 352.

At 360, if all possible column weight distributions are exhausted at 354, or if code search is to be stopped at 356, a winning column weight distribution is selected for each channel type. At 362, for each winning column weight distribution, multiple parity check matrices are generated, and code performance is evaluated over both the WGN and WiFi channels. At 364, winning parity-check matrices of codes that perform best over both channels as well as over only one of the two channels are selected, and control ends.

Figures 7A, 7B:
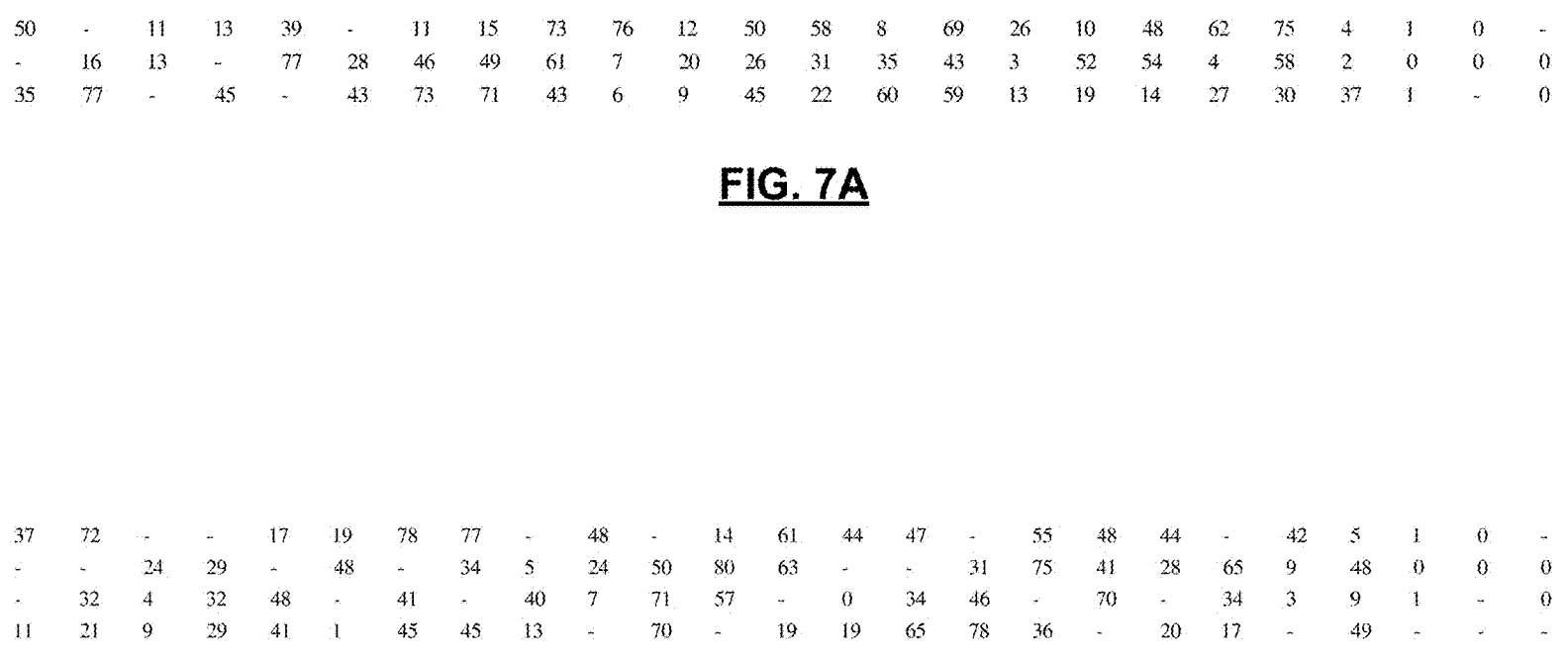

FIGS. 7A and 7B show examples of base matrices for code rate 7/8 generated using the code design methods of the present disclosure. FIG. 7A shows a 3×24 base matrix (3 rows and 24 columns) with number of punctured columns S=0. Some columns of the 3×24 base matrix may have a column weight of 2 while others may have a column weight of 3. The first 21 columns on the left hand side of the 3×24 base matrix correspond to 21 data bits or information bits. The last three columns on the right hand side of the 3×24 base matrix correspond to three parity bits. Thus the code rate is 21/24=7/8.

FIG. 7B shows a 4×25 base matrix (4 rows and 25 columns) with number of punctured columns S=1 (column 22 is punctured after encoding). Some columns of the 4×25 base matrix may have a column weight of 2, some other columns may have a column weight of 3, and still others may have a column weight of 4. After puncturing column 22, the first 21 columns on the left hand side of the 4×25 base matrix correspond to 21 data bits or information bits. The last three columns on the right hand side of the 4×25 base matrix correspond to three parity bits. Thus the code rate is 21/24=7/8.

FIGS. 8A-11B show various examples of performance of codes with code rate 7/8 generated using the 3×24 and 4×25 base matrices designed according to the present disclosure. In these figures, the notation "# of weighX is Y" (where X and Y are integers greater than or equal to zero) means "number of weight-2 column is 8."

Figure 8A:
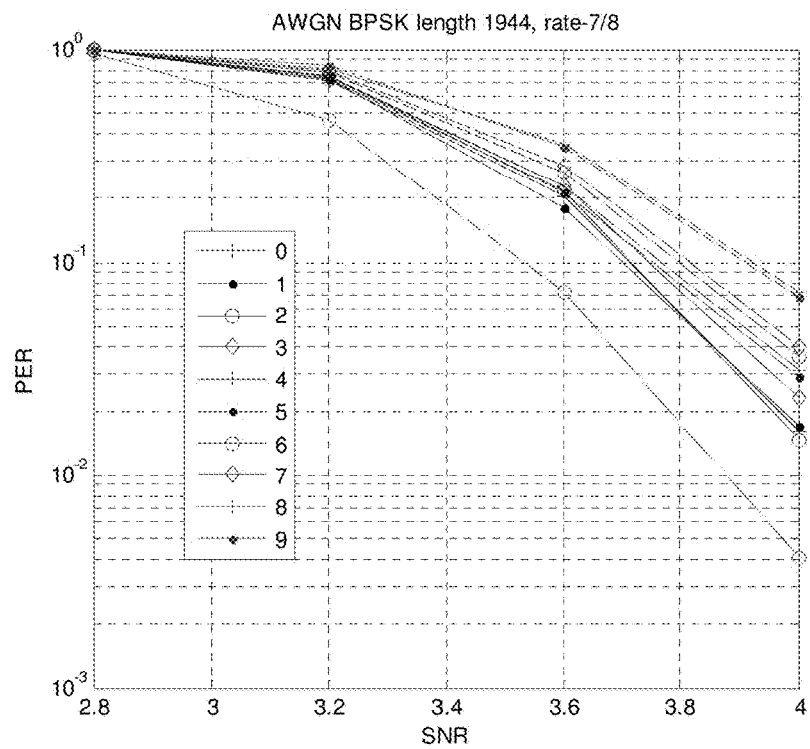
FIGS. 8A-11B show various examples of performance of codes with code rate 7/8 generated using 3×24 and 4×25 base matrices designed according to the present disclosure.
Figure 8B:
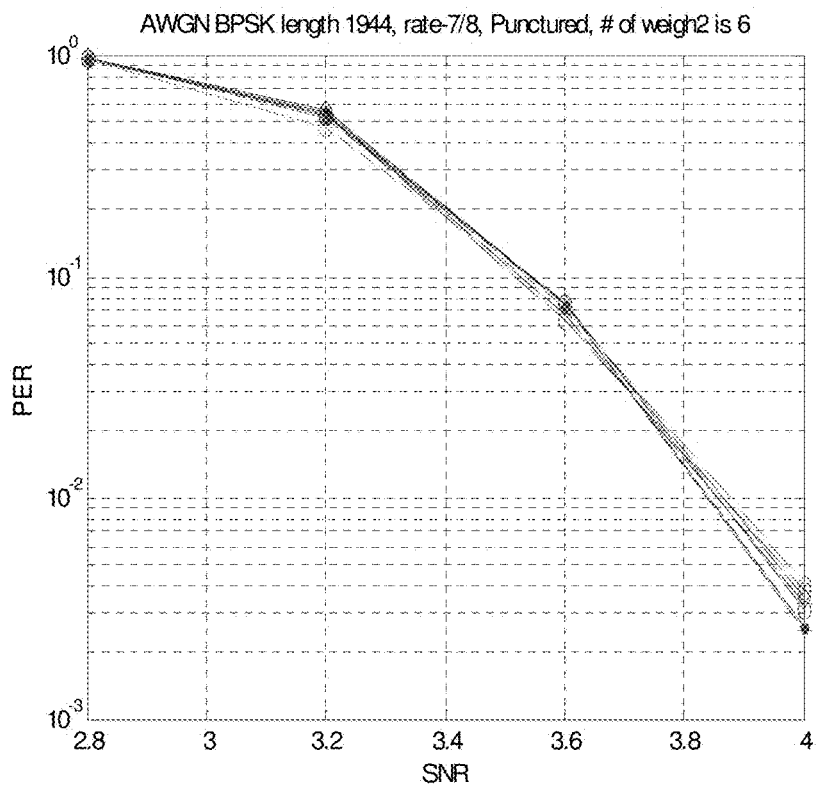

FIGS. 8A and 8B show the examples for AWGN channel with a block length of 1944 bits. FIG. 8A is an example of performance of the code generated using the 3×24 base matrix. FIG. 8B is an example of performance of the code generated using the 4×25 base matrix. The 4×25 base matrix shows about 0.2 dB gain over the 3×24 base matrix.

Figure 9A:
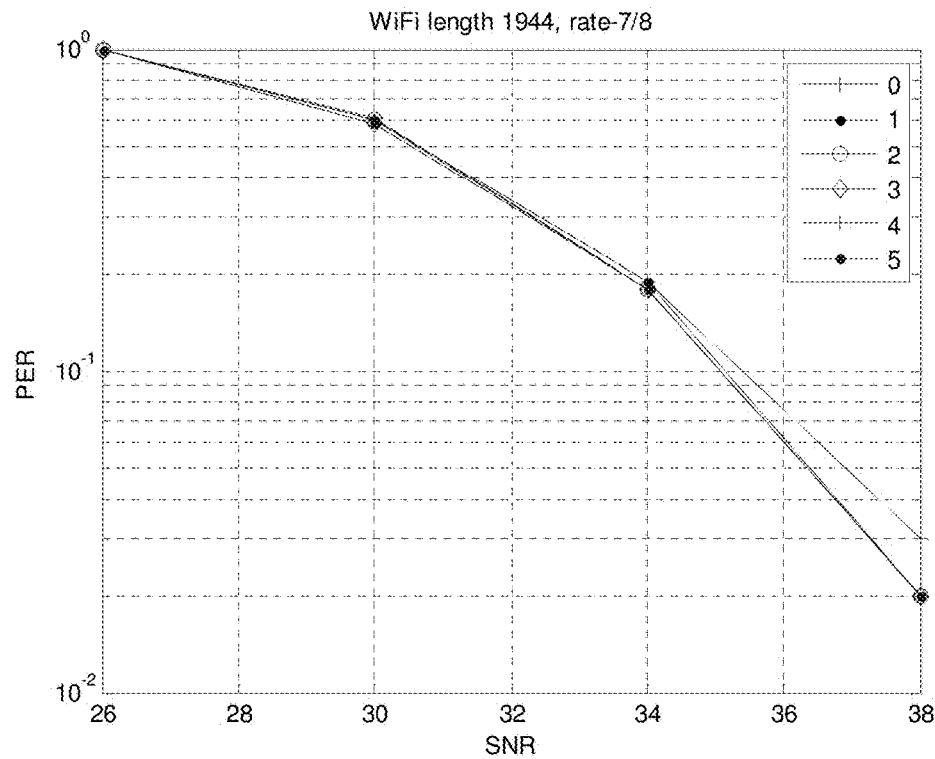
Figure 9B:
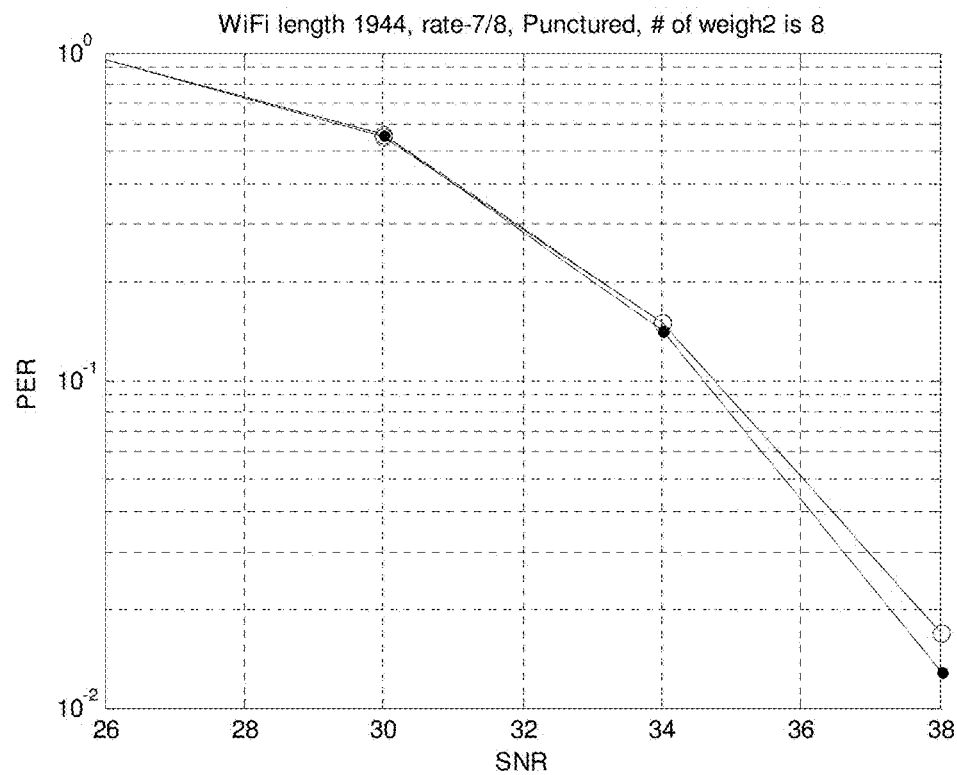

FIGS. 9A and 9B show the examples for WiFi channel with a block length of 1944 bits. FIG. 9A is an example of performance of the code generated using the 3×24 base matrix. FIG. 9B is an example of performance of the code generated using the 4×25 base matrix. At SNR=34 dB, the throughput gain with the 4×25 base matrix is about 2 or 3% over the 3×24 base matrix, and the gain is about 0.5 dB to 1.0 dB over the 3×24 base matrix.

Figure 10A:
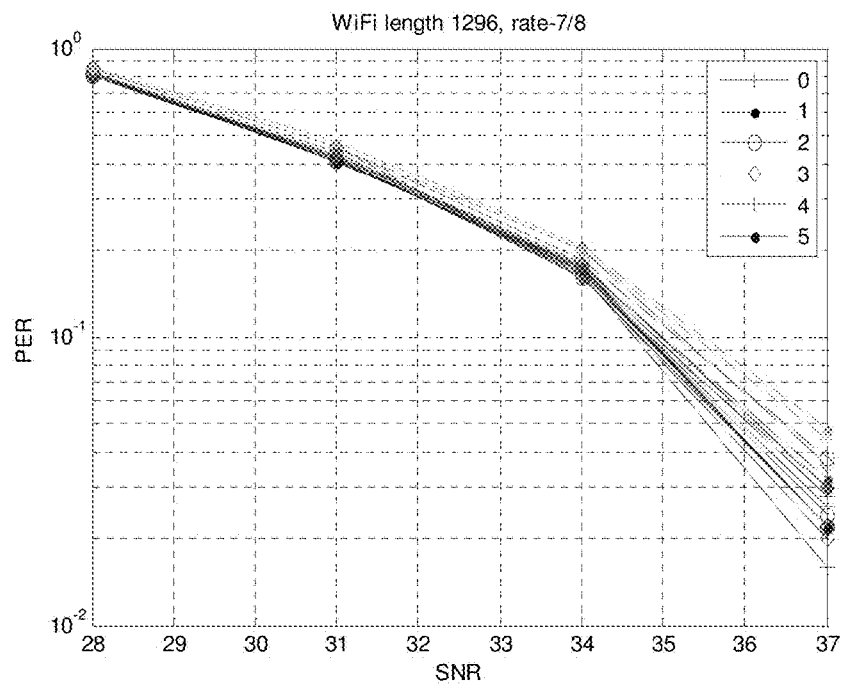
Figure 10B:
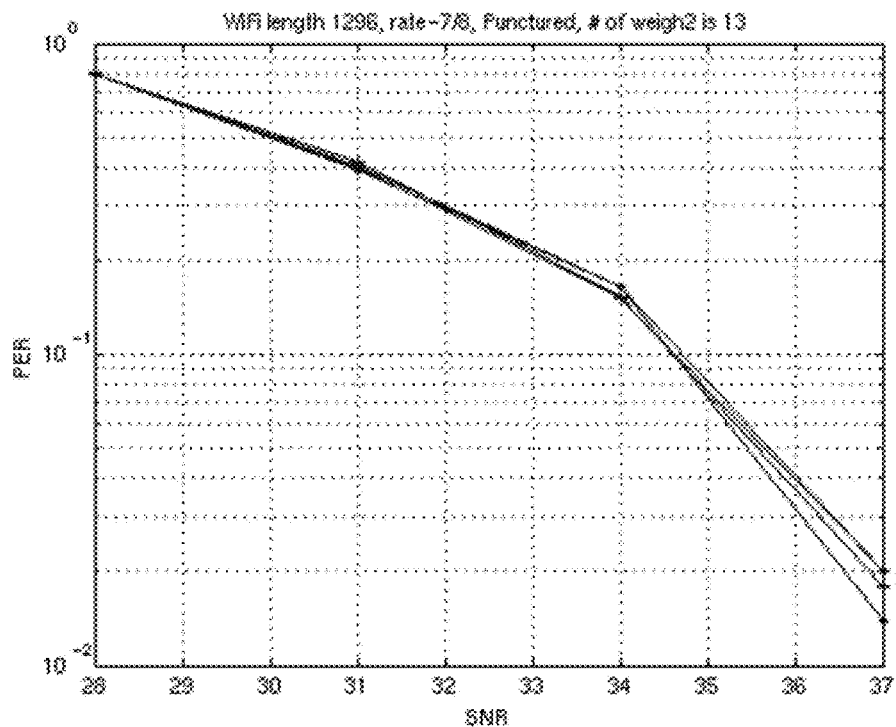

FIGS. 10A and 10B show the examples for WiFi channel with a block length of 1296 bits. FIG. 10A is an example of performance of the code generated using the 3×24 base matrix. FIG. 10B is an example of performance of the code generated using the 4×25 base matrix. The 4×25 base matrix shows a slight gain over the 3×24 base matrix.

Figure 11A:
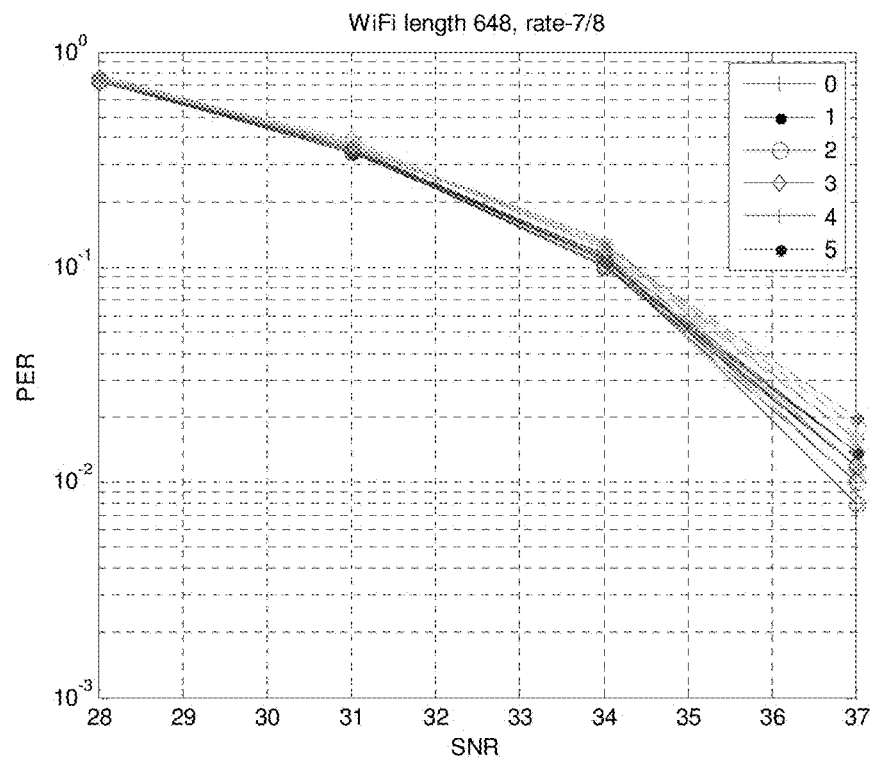
Figure 11B:
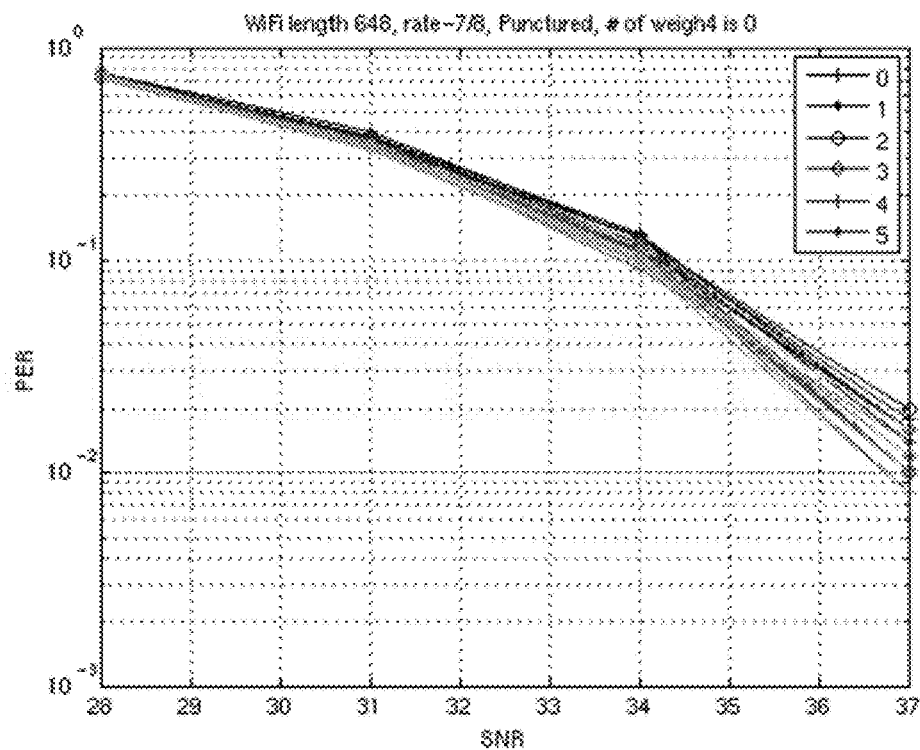

FIGS. 11A and 11B show the examples for WiFi channel with a block length of 648 bits. FIG. 11A is an example of performance of the code generated using the 3×24 base matrix. FIG. 11B is an example of performance of the code generated using the 4×25 base matrix. The 4×25 base matrix shows a slight gain over the 3×24 base matrix at 31 and 34 dBs.

Figure 12A:
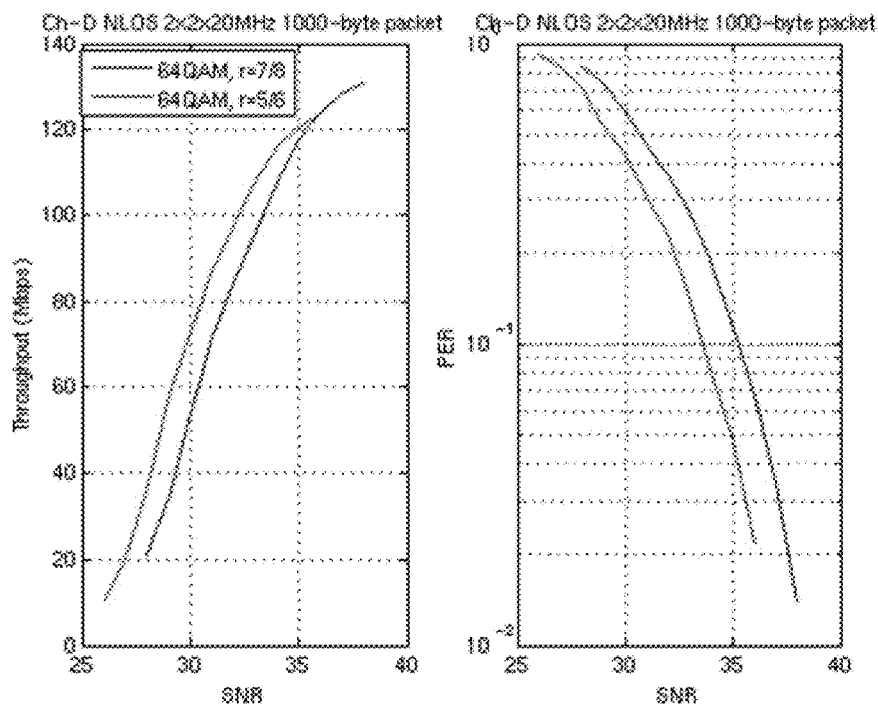
FIGS. 12A and 12B show throughput improvement of a code with code rate 7/8 found according to the present disclosure.
Figure 12B:
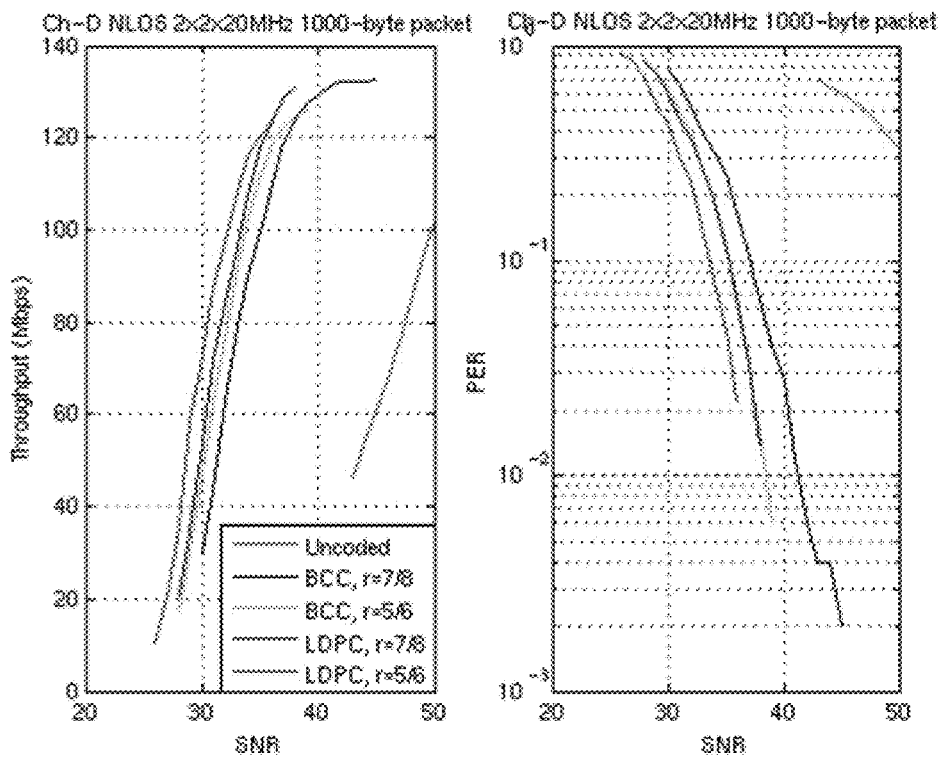

FIGS. 12A and 12B show throughput improvement of a code with code rate 7/8 found according to the present disclosure. The results are based on a simulation performed for a 20 MHz channel, using 2×2 MIMO configuration, 2 spatial streams, 64QAM modulation, and D non-line-of-sight (NLOS) WiFi channel.

Figures 13A, 13B:
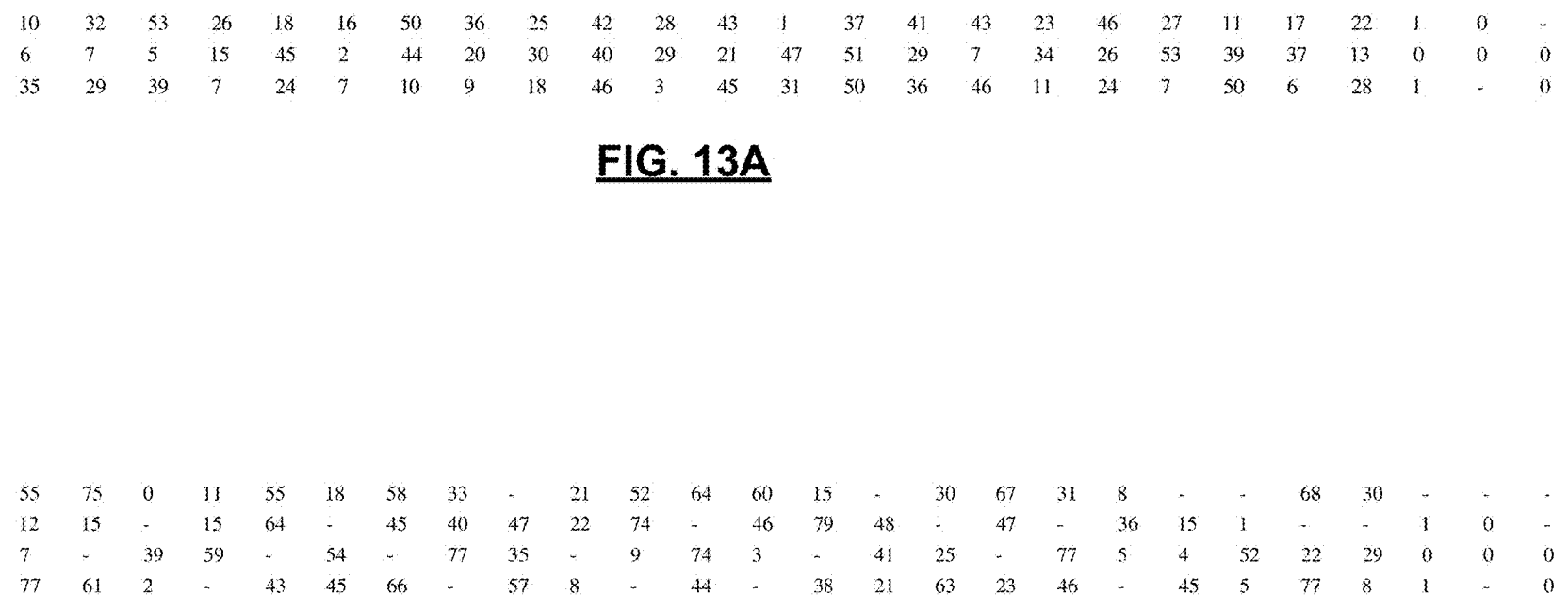

FIGS. 13A and 13B show examples of base matrices for code rate 11/12 generated using the code design methods of the present disclosure. FIG. 13A shows a 3×25 base matrix (3 rows and 25 columns) with number of punctured columns S=1 (column 23 is punctured after encoding). Some columns of the 3×25 base matrix may have a column weight of 2 while others may have a column weight of 3. After puncturing column 23, the first 22 columns on the left hand side of the 3×25 base matrix correspond to 22 data bits or information bits. The last two columns on the right hand side of the 3×25 base matrix correspond to two parity bits. Thus the code rate is 22/24=11/12.

FIG. 13B shows a 4×26 base matrix (4 rows and 26 columns) with number of punctured columns S=2 (columns 23 and 24 are punctured after encoding). Some columns of the 4×26 base matrix may have a column weight of 2, some other columns may have a column weight of 3, and still others may have a column weight of 4. After puncturing columns 23 and 24, the first 22 columns on the left hand side of the 4×26 base matrix correspond to 22 data bits or information bits. The last two columns on the right hand side of the 4×26 base matrix correspond to two parity bits. Thus the code rate is 22/24=11/12.

FIGS. 14-19 show various examples of 3×24 base matrices with column weights of 2 or 3 for code rate 7/8 with a block length of 1944 bits for WiFi channel generated without puncturing according to the present disclosure. Some columns of the 3×24 base matrix may have a column weight of 2 while others may have a column weight of 3. The first 21 columns on the left hand side of the 3×24 base matrix correspond to 21 data bits or information bits. The last three columns on the right hand side of the 3×24 base matrix correspond to three parity bits. Thus the code rate is 21/24=7/8.

FIGS. 20-28 show various examples of 4×25 base matrices with column weights of 2, 3, or 4 for code rate 7/8 with a block length of 1944 bits for WiFi channel generated with puncturing of one column (e.g., column 22) according to the present disclosure. Some columns of the 4×25 base matrix may have a column weight of 2, some other columns may have a column weight of 3, and still others may have a column weight of 4. After puncturing column 22, the first 21 columns on the left hand side of the 4×25 base matrix correspond to 21 data bits or information bits. The last three columns on the right hand side of the 4×25 base matrix correspond to three parity bits. Thus the code rate is 21/24=7/8.

Figure 29A:
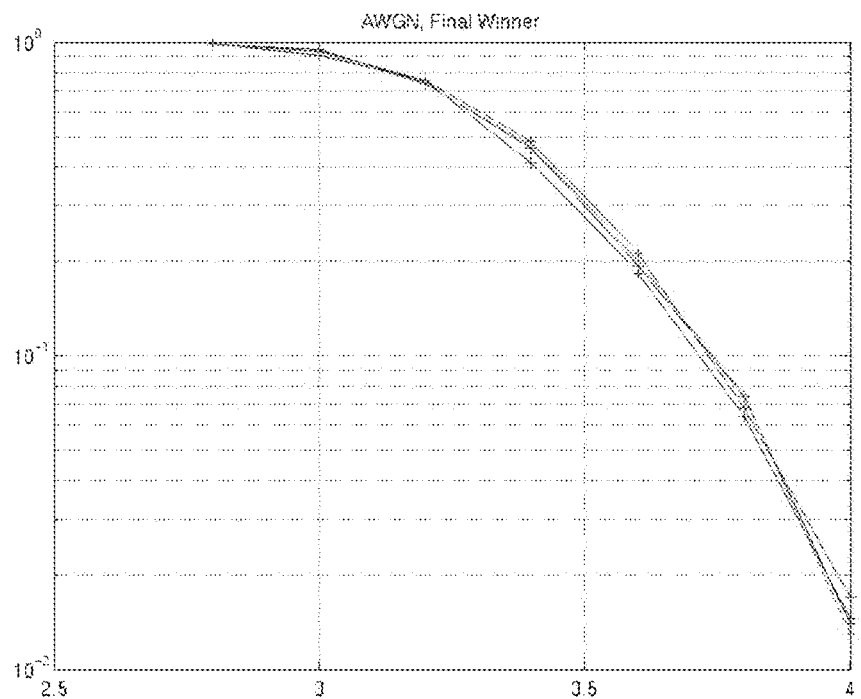
FIGS. 29A-30B show various examples of performance of codes with code rate 7/8 generated using 3×24 and 4×25 base matrices designed according to the present disclosure.
Figure 29B:
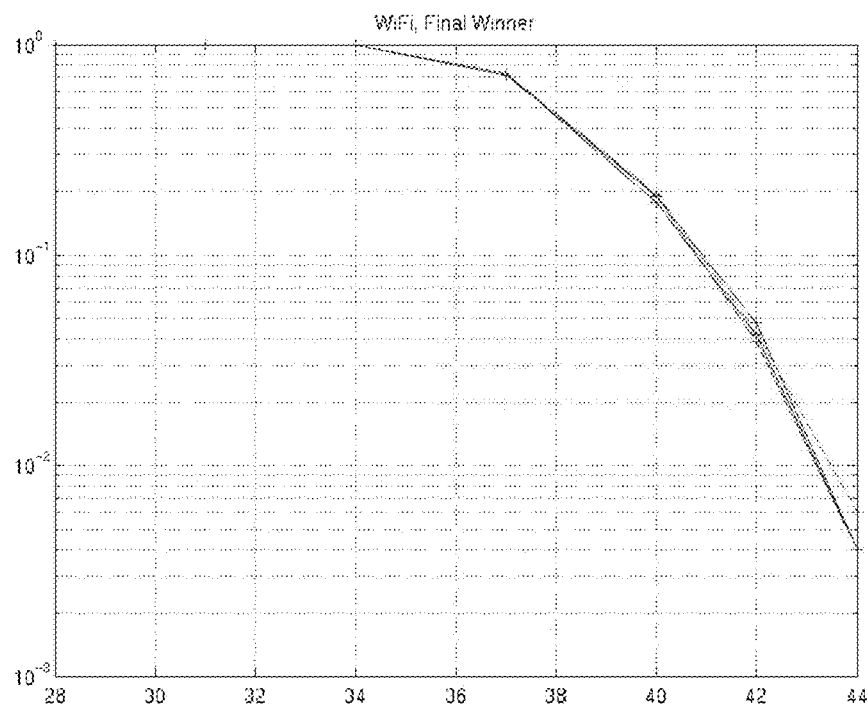

FIGS. 29A-30B show various examples of performance of codes with code rate 7/8 generated using the 3×24 and 4×25 base matrices designed according to the present disclosure. FIGS. 29A and 29B show examples of performance of the codes with code rate 7/8 generated using the 3×24 base matrices designed according to the present disclosure. FIG. 29A shows the performance for AWGN channel with BPSK modulation. FIG. 29B shows the performance for WiFi channel (e.g., IEEE802.11ac 80 MHz channel) using 256QAM modulation, 2×2 antenna configuration, 2 spatial streams, and D NLOS channel.

Figure 30A:
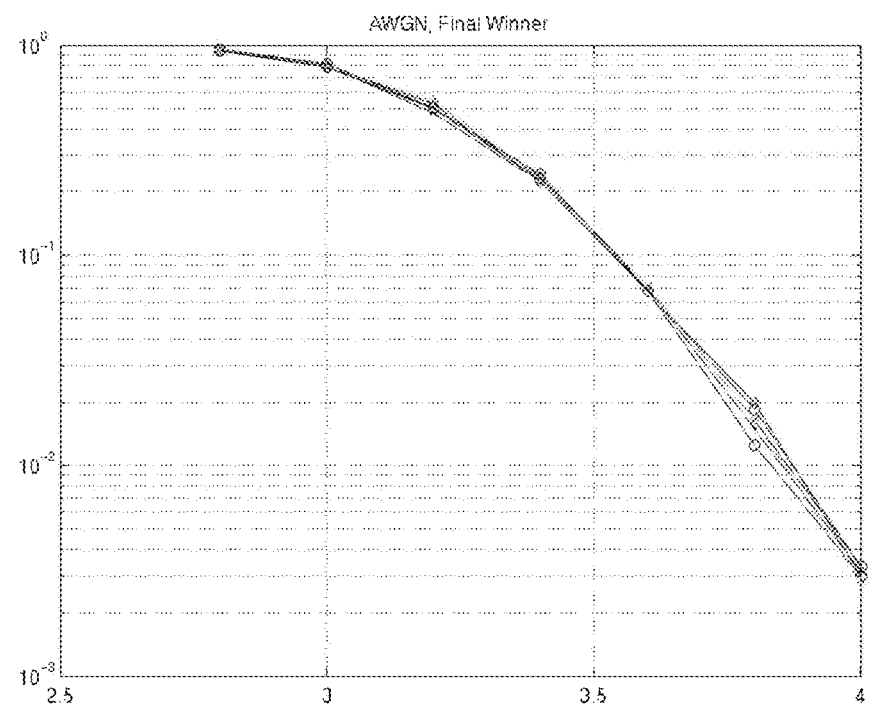
Figure 30B:
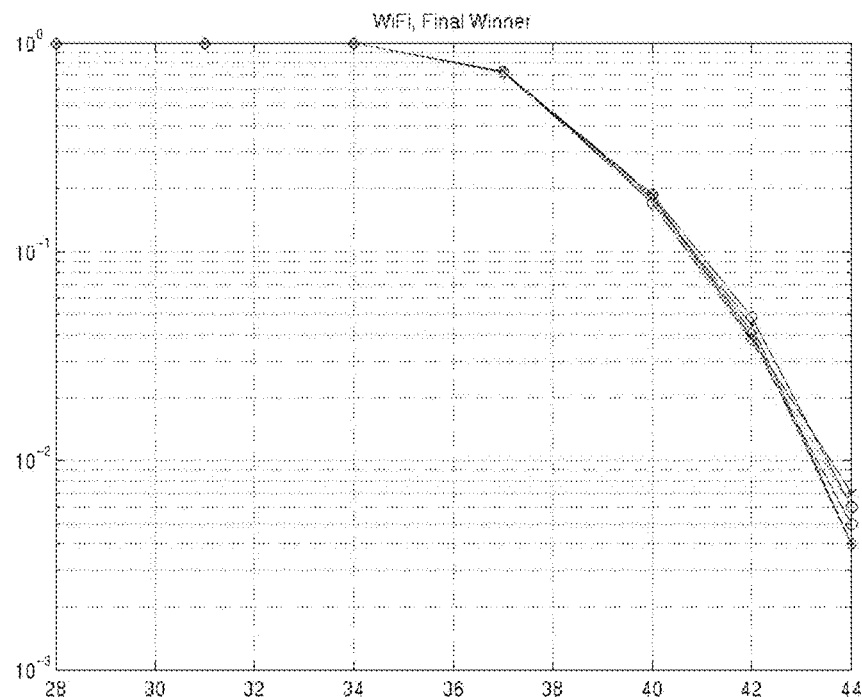

FIGS. 30A and 30B show examples of performance of the codes with code rate 7/8 generated using the 4×25 base matrices designed according to the present disclosure. FIG. 30A shows the performance for AWGN channel with BPSK modulation. FIG. 30B shows the performance for WiFi channel (e.g., IEEE802.11ac 80 MHz channel) using 256QAM modulation, 2×2 antenna configuration, 2 spatial streams, and D NLOS channel.

FIGS. 31-38 show various examples of 3×25 base matrices with column weights of 2 or 3 for code rate 11/12 with a block length of 1944 bits for WiFi channel generated with puncturing of one column (e.g., column 23) according to the present disclosure. Some columns of the 3×25 base matrix may have a column weight of 2 while others may have a column weight of 3. After puncturing column 23, the first 22 columns on the left hand side of the 3×25 base matrix correspond to 22 data bits or information bits. The last two columns on the right hand side of the 3×25 base matrix correspond to two parity bits. Thus the code rate is 22/24=11/12.

FIGS. 39-47 show various examples of 4×26 base matrices with column weights of 2, 3, or 4 for code rate 11/12 with a block length of 1944 bits for WiFi channel generated with puncturing of two of the columns 23-26 (e.g., columns 23 and 24) according to the present disclosure. Some columns of the 4×26 base matrix may have a column weight of 2, some other columns may have a column weight of 3, and still others may have a column weight of 4. After puncturing two of the columns 23-26 (e.g., columns 23 and 24), the first 22 columns on the left hand side of the 4×26 base matrix correspond to 22 data bits or information bits. The last two columns on the right hand side of the 4×26 base matrix correspond to two parity bits. Thus the code rate is 22/24=11/12.

In the base matrices described above, each element of the base matrix represents a submatrix. For example, in a 3×25 base matrix for a block length of 1944 bits, each element of the 3×25 base matrix represents a 81×81 submatrix matrix, where 81 is a ratio of 1944 bits per block divided by 24 codewords per block. The 81×81 submatrix has a single 1 in each row. The 1's in each row of the 81×81 submatrix are along a diagonal extending from top left to right bottom positions in the 81×81 submatrix. All other elements of the 81×81 submatrix are 0's. A value of each element of the base matrix indicates a number of right shifts performed on the rows of the corresponding submatrix. For example, if an element of the 3×25 base matrix has a value of 0, no shifts are performed on the rows of the corresponding 81×81 submatrix. A value of −1 (which is sometimes shown as simply "−" as in FIGS. 7A-7B and 13A-13B) indicates that all elements of the corresponding submatrix are zeros, and shifts are irrelevant. A value other than a 0 or a −1 includes an integer N greater than or equal to 1 and indicates that N right shifts are performed on the rows of the corresponding submatrix.

FIGS. 48A-51B show various examples of performance of codes with code rate 11/12 generated using the 3×25 and 4×26 base matrices designed according to the present disclosure. FIGS. 48A and 48B show examples of performance of the codes with code rate 11/12 generated using the 3×25 base matrices (shown in FIGS. 31-33) designed according to the present disclosure. FIG. 48A shows the performance for AWGN channel with BPSK modulation. FIG. 48B shows the performance for WiFi channel (e.g., IEEE802.11ac 80 MHz channel) using 256QAM modulation, 2×2 antenna configuration, 2 spatial streams, and D NLOS channel. The performance is good on both AWGN and WiFi channels.

FIGS. 49A and 49B show examples of performance of the codes with code rate 11/12 generated using the 3×25 base matrices (shown in FIGS. 34-38) designed according to the present disclosure. FIG. 49A shows the performance for AWGN channel with BPSK modulation. FIG. 49B shows the performance for WiFi channel (e.g., IEEE802.11ac 80 MHz channel) using 256QAM modulation, 2×2 antenna configuration, 2 spatial streams, and D NLOS channel. The performance for WiFi channel is better than the performance for AWGN channel.

FIGS. 50A and 50B show examples of performance of the codes with code rate 11/12 generated using the 4×26 base matrices (shown in FIGS. 39-44) designed according to the present disclosure. FIG. 50A shows the performance for AWGN channel with BPSK modulation. FIG. 50B shows the performance for WiFi channel (e.g., IEEE802.11ac 80 MHz channel) using 256QAM modulation, 2×2 antenna configuration, 2 spatial streams, and D NLOS channel. The performance is good on both AWGN and WiFi channels.

FIGS. 51A and 51B show examples of performance of the codes with code rate 11/12 generated using the 4×26 base matrices (shown in FIGS. 45-47) designed according to the present disclosure. FIG. 51A shows the performance for AWGN channel with BPSK modulation. FIG. 51B shows the performance for WiFi channel (e.g., IEEE802.11ac 80 MHz channel) using 256QAM modulation, 2×2 antenna configuration, 2 spatial streams, and D NLOS channel. The performance for WiFi channel is better than the performance for AWGN channel.

The wireless communications described in the present disclosure can be conducted in full or partial compliance with IEEE standard 802.11-2012, IEEE standard 802.16-2009, IEEE standard 802.20-2008, and/or Bluetooth Core Specification v4.0. In various implementations, Bluetooth Core Specification v4.0 may be modified by one or more of Bluetooth Core Specification Addendums 2, 3, or 4. In various implementations, IEEE 802.11-2012 may be supplemented by draft IEEE standard 802.11ac, draft IEEE standard 802.11ad, and/or draft IEEE standard 802.11ah.

The foregoing description is merely illustrative in nature and is in no way intended to limit the disclosure, its application, or uses. The broad teachings of the disclosure can be implemented in a variety of forms. Therefore, while this disclosure includes particular examples, the true scope of the disclosure should not be so limited since other modifications will become apparent upon a study of the drawings, the specification, and the following claims. As used herein, the phrase at least one of A, B, and C should be construed to mean a logical (A OR B OR C), using a non-exclusive logical OR, and should not be construed to mean "at least one of A, at least one of B, and at least one of C." It should be understood that one or more steps within a method may be executed in different order (or concurrently) without altering the principles of the present disclosure.

In this application, including the definitions below, the term "module" or the term "controller" may be replaced with the term "circuit." The term "module" may refer to, be part of, or include: an Application Specific Integrated Circuit (ASIC); a digital, analog, or mixed analog/digital discrete circuit; a digital, analog, or mixed analog/digital integrated circuit; a combinational logic circuit; a field programmable gate array (FPGA); a processor circuit (shared, dedicated, or group) that executes code; a memory circuit (shared, dedicated, or group) that stores code executed by the processor circuit; other suitable hardware components that provide the described functionality; or a combination of some or all of the above, such as in a system-on-chip.

The module may include one or more interface circuits. In some examples, the interface circuits may include wired or wireless interfaces that are connected to a local area network (LAN), the Internet, a wide area network (WAN), or combinations thereof. The functionality of any given module of the present disclosure may be distributed among multiple modules that are connected via interface circuits. For example, multiple modules may allow load balancing. In a further example, a server (also known as remote, or cloud) module may accomplish some functionality on behalf of a client module.

The term code, as used above, may include software, firmware, and/or microcode, and may refer to programs, routines, functions, classes, data structures, and/or objects. The term shared processor circuit encompasses a single processor circuit that executes some or all code from multiple modules. The term group processor circuit encompasses a processor circuit that, in combination with additional processor circuits, executes some or all code from one or more modules. References to multiple processor circuits encompass multiple processor circuits on discrete dies, multiple processor circuits on a single die, multiple cores of a single processor circuit, multiple threads of a single processor circuit, or a combination of the above. The term shared memory circuit encompasses a single memory circuit that stores some or all code from multiple modules. The term group memory circuit encompasses a memory circuit that, in combination with additional memories, stores some or all code from one or more modules.

The term memory circuit is a subset of the term computer-readable medium. The term computer-readable medium, as used herein, does not encompass transitory electrical or electromagnetic signals propagating through a medium (such as on a carrier wave); the term computer-readable medium may therefore be considered tangible and non-transitory. Non-limiting examples of a non-transitory, tangible computer-readable medium are nonvolatile memory circuits (such as a flash memory circuit, an erasable programmable read-only memory circuit, or a mask read-only memory circuit), volatile memory circuits (such as a static random access memory circuit or a dynamic random access memory circuit), magnetic storage media (such as an analog or digital magnetic tape or a hard disk drive), and optical storage media (such as a CD, a DVD, or a Blu-ray Disc).

The apparatuses and methods described in this application may be partially or fully implemented by a special purpose computer created by configuring a general purpose computer to execute one or more particular functions embodied in computer programs. The functional blocks, flowchart components, and other elements described above serve as software specifications, which can be translated into the computer programs by the routine work of a skilled technician or programmer.

The computer programs include processor-executable instructions that are stored on at least one non-transitory, tangible computer-readable medium. The computer programs may also include or rely on stored data. The computer programs may encompass a basic input/output system (BIOS) that interacts with hardware of the special purpose computer, device drivers that interact with particular devices of the special purpose computer, one or more operating systems, user applications, background services, background applications, etc.

The computer programs may include: (i) descriptive text to be parsed, such as HTML (hypertext markup language) or XML (extensible markup language), (ii) assembly code, (iii) object code generated from source code by a compiler, (iv) source code for execution by an interpreter, (v) source code for compilation and execution by a just-in-time compiler, etc. As examples only, source code may be written using syntax from languages including C, C++, C#, Objective C, Haskell, Go, SQL, R, Lisp, Java®, Fortran, Perl, Pascal, Curl, OCaml, Javascript®, HTML5, Ada, ASP (active server pages), PHP, Scala, Eiffel, Smalltalk, Erlang, Ruby, Flash®, Visual Basic®, Lua, and Python®.

None of the elements recited in the claims are intended to be a means-plus-function element within the meaning of 35 U.S.C. § 112(f) unless an element is expressly recited using the phrase "means for," or in the case of a method claim using the phrases "operation for" or "step for."

What is claimed is:

1. A wireless device comprising:
   a code rate selecting module configured to select a code rate of k/n to encode k units of data into n units of data using a low-density parity-check (LDPC) code, where k and n are integers greater than 1, and k<n;
   a matrix generating module configured to generate a matrix with (R+S) rows and (C+S) columns, where R and C are integers greater than 1, R=C/n, and S is an integer greater than or equal to zero and denotes a number of columns of the matrix deleted after encoding the k units of data using the LDPC code;

a code generating module configured to generate a plurality of LDPC codes based on the matrix with (R+S) rows and (C+S) columns; and a transmitting module configured to transmit data encoded using one of the plurality of LDPC codes over a wireless network, wherein the code rate for the selected LDPC code is greater than 5/6 and less than or equal to 11/12;

wherein for a selected code rate k/n>5/6 and less than or equal to 11/12, an LDPC code generated using a 25 column matrix provides a higher performance in terms of signal-to-noise ratio (SNR) and packet error rate (PER) than an LDPC code generated using a 24 column matrix; and wherein an LDPC code generated using the code rate k/n>5/6 and less than or equal to 11/12 provides a higher throughput than LDPC codes generated using code rates less than or equal to 5/6.

2. The wireless device of claim 1, further comprising a column weight selecting module configured to select a column weight from 2 to (R+S), where the column weight denotes a number of nonzero entries in a column of the matrix.

3. The wireless device of claim 1, wherein the matrix is a concentrated representation of a parity-check matrix of the LDPC code.

4. The wireless device of claim 1, further comprising:
a column weight selecting module configured to select a column weight distribution for the matrix, wherein a column weight denotes a number of nonzero entries in a column of the matrix;

wherein the matrix generating module is configured to generate the matrix in accordance with the column weight distribution; and a cyclic shift module configured to select cyclic shifts for each entry in the matrix, wherein based on the cyclic shifts,
a girth of the LDPC code has a lower bound determined by a first threshold, wherein the girth of the LDPC code is a length of a shortest cycle of the LDPC code; and
an Approximate Cycle Extrinsic message degree (ACE) metric for any cycle having girth no more than a predetermined threshold has a lower bound determined by a second threshold, wherein the ACE metric denotes a total number of edges coming into variable nodes of one cycle of the LDPC code.

5. The wireless device of claim 4, further comprising:
a parameter selecting module configured to select a plurality of parameters ($girth_i$, $ACE_i$), where $girth_i$ is an integer greater than a predetermined threshold greater than zero, $ACE_i$ is an integer greater than or equal to zero, $1<i<n$, and i and n are integers greater than 1;

wherein the column weight selecting module is configured to select a plurality of column weight distributions for the matrix; and wherein the code generating module is configured to generate, for each of the column weight distributions, a plurality of LDPC codes with the $girth_i$ and the $ACE_i$.

6. The wireless device of claim 5, wherein:
the matrix generating module is configured to generate a matrix for one of the plurality of LDPC codes in accordance with one of the plurality of column weight distributions;

the cyclic shift module is configured to generate cyclic shifts for each entry in the matrix; and the code generating module is configured to determine, based on the cyclic shifts, whether the one of the plurality of LDPC codes meets the following predetermined criteria:
the girth of the one of the plurality of LDPC codes has the lower bound determined by the predetermined threshold; and
the ACE metric for any cycle having girth no more than the first threshold has the lower bound determined by the second threshold, wherein the first threshold is greater than the predetermined threshold.

7. The wireless device of claim 5, wherein the code generating module is configured to generate, for each of the column weight distributions, the plurality of LDPC codes, by initially using the parameters ($girth_i$, $ACE_i$) with highest values of $girth_i$ and $ACE_i$, and by subsequently using the parameters ($girth_i$, $ACE_i$) with decreasing values of $girth_i$ and $ACE_i$ until one of the plurality of LDPC codes meets the predetermined criteria.

8. The wireless device of claim 7, wherein in response to none of the plurality of LDPC codes generated using the parameters ($girth_i$, $ACE_i$) meeting the criteria:
the parameter selecting module is configured to select a plurality of parameters ($girth_j$, $ACE_j$), where $girth_j$ is an integer greater than zero and less than the predetermined threshold for girths, $ACE_j$ is an integer greater than or equal to zero, $1<j<n$, and j and n are integers greater than 1; and the code generating module is configured to generate, for each of the column weight distributions, the plurality of LDPC codes, by initially using the parameters ($girth_j$, $ACE_j$) with highest values of $girth_j$ and $ACE_j$, and by subsequently using the parameters ($girth_j$, $ACE_j$) with decreasing values of $girth_j$ and $ACE_j$ until one of the plurality of LDPC codes meets the criteria.

9. The wireless device of claim 7, wherein:
the column weight selecting module is configured to determine a mean column weight of the plurality of column weight distributions and to select upper and lower bounds of the plurality of column weight distributions based on the mean column weight; and the code generating module is configured to generate the plurality of LDPC codes only for values of the plurality of column weight distributions between the upper and lower bounds.

10. The wireless device of claim 7, further comprising an evaluating module configured to:
evaluate performance of each of the plurality LDPC codes over one or more of an additive white Gaussian noise (AWGN) channel and a WiFi channel using a plurality of criteria including packet error rate and signal-to-noise ratio, wherein the plurality LDPC codes have different code rates, block lengths, modulations, number of deleted columns from respective matrices, and number of decoding iterations; and identify one or more of the plurality of column weight distributions for which one or more of the plurality of LDPC codes have performance greater than or equal to a predetermined level.

11. The wireless device of claim 10, wherein for each of the column weight distributions, the code generating module is configured to stop generating the plurality of LDPC codes in response to two consecutive ones of the plurality LDPC codes having performance worse than prior ones of the plurality LDPC codes.

12. The wireless device of claim 10, wherein:
the code generating module is configured to generate, for the one or more of the plurality of column weight distributions for which the one or more of the plurality of LDPC codes have performance greater than or equal to the predetermined level, a plurality of codewords using respective LDPC codes; and
the evaluating module is configured to evaluate performance of the respective LDPC codes over both AWGN and WiFi channels, and to identify one or more parity-check matrices of the respective LDPC codes that perform best over (i) both AWGN and WiFi channels and (ii) either AWGN or WiFi channel.

13. A wireless device comprising:
a column weight selecting module configured to select a column weight distribution for a matrix of a low-density parity-check (LDPC) code, wherein a column weight denotes a number of nonzero entries in a column of the matrix of the LDPC code;
a matrix generating module configured to generate the matrix for the LDPC code in accordance with the column weight distribution;
a cyclic shift selecting module configured to select cyclic shifts for each entry in the matrix, wherein based on the cyclic shifts,
a girth of the LDPC code has a lower bound determined by a first threshold, wherein the girth of the LDPC code is a length of a shortest cycle of the LDPC code; and
an Approximate Cycle Extrinsic message degree (ACE) metric for any cycle having girth no more than a predetermined threshold has a lower bound determined by a second threshold, wherein the ACE metric denotes a total number of edges coming into variable nodes of one cycle of the LDPC code;
a code generating module configured to generate the LDPC code with the girth and the ACE; and
a transmitting module configured to transmit data encoded using the LDPC code over a wireless network with a code rate greater than 5/6 and less than or equal to 11/12;
wherein for a selected code rate k/n>5/6 and less than or equal to 11/12, an LDPC code generated using a 25 column matrix provides a higher performance in terms of signal-to-noise ratio (SNR) and packet error rate (PER) than an LDPC code generated using a 24 column matrix; and
wherein an LDPC code generated using the code rate k/n>5/6 and less than or equal to 11/12 provides a higher throughput than LDPC codes generated using code rates less than or equal to 5/6.

14. The wireless device of claim 13, wherein the matrix generating module is configured to generate the matrix for the LDPC code in accordance with the column weight distribution using a progressive-edge-growth (PEG) method.

15. The wireless device of claim 13, wherein the matrix is a concentrated representation of a parity-check matrix of the LDPC code.

16. A wireless device comprising:
a parameter selecting module configured to select a plurality of parameters (girth$_i$, ACE$_i$), where girth denotes a length of a shortest cycle of a low-density parity-check (LDPC) code, ACE is an Approximate Cycle Extrinsic message degree (ACE) of the LDPC code and denotes a total number of edges coming into variable nodes of one cycle of the LDPC code, girth$_i$ is an integer greater than a predetermined threshold greater than zero, ACE$_i$ is an integer greater than or equal to zero, 1<i<n, and i and n are integers greater than 1;
a column weight selecting module configured to select a plurality of column weight distributions for a matrix of the LDPC code, where a column weight denotes a number of nonzero entries in a column of the matrix of the LDPC code;
a code generating module configured to generate, for each of the column weight distributions, a plurality of LDPC codes with the girth$_i$ and the ACE$_i$; and
a transmitting module configured to transmit data encoded using one of the plurality of LDPC codes with the girth$_i$ and the ACE$_i$ over a wireless network, wherein a code rate for the selected LDPC code is greater than 5/6 and less than or equal to 11/12;
wherein for a selected code rate k/n>5/6 and less than or equal to 11/12, an LDPC code generated using a 25 column matrix provides a higher performance in terms of signal-to-noise ratio (SNR) and packet error rate (PER) than an LDPC code generated using a 24 column matrix; and
wherein an LDPC code generated using the code rate k/n>5/6 and less than or equal to 11/12 provides a higher throughput than LDPC codes generated using code rates less than or equal to 5/6.

17. The wireless device of claim 16, wherein the code generating module comprises:
a matrix generating module configured to generate a matrix for one of the plurality of LDPC codes in accordance with one of the plurality of column weight distributions; and
a cyclic shift generating module configured to generate cyclic shifts for each entry in the matrix, and
wherein the code generating module is configured to determine, based on the cyclic shifts, whether the one of the plurality of LDPC codes meets the following criteria:
a girth of the one of the plurality of LDPC codes has a lower bound determined by the predetermined threshold; and
an ACE metric for any cycle having girth no more than a first threshold has a lower bound determined by a second threshold, wherein the first threshold is greater than the predetermined threshold.

18. The wireless device of claim 16, wherein the code generating module is configured to generate, for each of the column weight distributions, the plurality of LDPC codes, by initially using the parameters (girth$_i$, ACE$_i$) with highest values of girth$_i$ and ACE$_i$, and by subsequently using the parameters (girth$_i$, ACE$_i$) with decreasing values of girth$_i$ and ACE$_i$ until one of the plurality of LDPC codes meets the following criteria:
a girth of the one of the plurality of LDPC codes has a lower bound determined by the predetermined threshold; and
an ACE metric for any cycle having girth no more than a first threshold has a lower bound determined by a second threshold, wherein the first threshold is greater than the predetermined threshold.

19. The wireless device of claim 18, wherein in response to none of the plurality of LDPC codes generated using the parameters (girth$_i$, ACE$_i$) meeting the criteria:
the parameter selecting module is configured to select a plurality of parameters (girth$_j$, ACE$_j$), where girth$_j$ is an integer greater than zero and less than the predetermined threshold for $girth_j$, $ACE_j$ is an integer greater than or equal to zero, $1 \leq j \leq n$, and j and n are integers greater than 1; and the code generating module is configured to generate, for each of the column weight distributions, the plurality of LDPC codes, by initially using the parameters ($girth_j$, $ACE_j$) with highest values of $girth_j$ and $ACE_j$, and by subsequently using the parameters ($girth_j$, $ACE_j$) with decreasing values of $girth_j$ and $ACE_j$ until one of the plurality of LDPC codes meets the criteria.

20. The wireless device of claim 18, wherein:

the column weight selecting module is configured to determine a mean column weight of the plurality of column weight distributions and to select upper and lower bounds of the plurality of column weight distributions based on the mean column weight; and the code generating module is configured to generate the plurality of LDPC codes only for values of the plurality of column weight distributions between the upper and lower bounds.

21. The wireless device of claim 18, further comprising an evaluating module configured to:

evaluate performance of each of the plurality LDPC codes over one or more of an additive white Gaussian noise (AWGN) channel and a WiFi channel using a plurality of criteria including packet error rate and signal-to-noise ratio, wherein the plurality LDPC codes have different code rates, block lengths, modulations, number of deleted columns from respective matrices, and number of decoding iterations; and identify one or more of the plurality of column weight distributions for which one or more of the plurality of LDPC codes have performance greater than or equal to a predetermined level.

22. The wireless device of claim 21, wherein for each of the column weight distributions, the code generating module is configured to stop generating the plurality of LDPC codes in response to two consecutive ones of the plurality LDPC codes having performance worse than prior ones of the plurality LDPC codes.

23. The wireless device of claim 21, wherein:

the code generating module is configured to generate, for the one or more of the plurality of column weight distributions for which the one or more of the plurality of LDPC codes have performance greater than or equal to the predetermined level, a plurality of codewords using respective LDPC codes; and the evaluating module is configured to evaluate performance of the respective LDPC codes over both AWGN and WiFi channels, and to identify one or more parity-check matrices of the respective LDPC codes that perform best over (i) both AWGN and WiFi channels and (ii) either AWGN or WiFi channel.

* * * * *